(12) United States Patent
Kishi et al.

(10) Patent No.: US 7,242,131 B2
(45) Date of Patent: Jul. 10, 2007

(54) ULTRASONIC MOTOR

(75) Inventors: Masanori Kishi, Hachioji (JP); Takashi Okamura, Hachioji (JP)

(73) Assignee: Olympus Corporation, Tokyo (JP)

( * ) Notice: Subject to any disclaimer, the term of this patent is extended or adjusted under 35 U.S.C. 154(b) by 127 days.

(21) Appl. No.: 11/119,565

(22) Filed: May 2, 2005

(65) Prior Publication Data

US 2005/0253484 A1 Nov. 17, 2005

(30) Foreign Application Priority Data

May 12, 2004 (JP) .............................. 2004-142698
Jun. 25, 2004 (JP) .............................. 2004-188748

(51) Int. Cl.
*H01L 41/08* (2006.01)

(52) U.S. Cl. ................................. 310/323.02

(58) Field of Classification Search ..............................
310/323.02–323.08, 323.12, 323.16, 32
See application file for complete search history.

(56) References Cited

U.S. PATENT DOCUMENTS

| | | | |
|---|---|---|---|
| 4,742,260 A * | 5/1988 | Shimizu et al. | 310/323.16 |
| 4,935,659 A * | 6/1990 | Naka et al. | 310/328 |
| 4,937,488 A * | 6/1990 | Fujie et al. | 310/323.03 |
| 5,146,129 A * | 9/1992 | Tamura et al. | 310/323.16 |
| 5,554,905 A * | 9/1996 | Gschwind et al. | 310/323.02 |
| 6,121,717 A * | 9/2000 | Diefenbach et al. | 310/323.02 |

FOREIGN PATENT DOCUMENTS

| | | |
|---|---|---|
| JP | 03-195379 | 8/1991 |
| JP | 04-211210 | 8/1992 |
| JP | 08-140373 | 5/1996 |
| JP | 08-182356 | 7/1996 |

* cited by examiner

*Primary Examiner*—Mark Budd
(74) *Attorney, Agent, or Firm*—Volpe and Koening, P.C.

(57) ABSTRACT

An ultrasonic motor includes rotors and an annular stator, which are integrated in the rotational direction, a rectangular parallelepiped multilayer piezoelectric transducer, a support shaft, and a transducer with drivers. The support shaft is attached to the outer circumference of the stator and arranged along the radial direction, and the drivers are abutted by a spring urging force to the rotors arranged on both sides of the stator in the axial direction, and are clamped with the rotors. When the transducer is driven so as to excite an elliptical movement produced by combining a bending standing-wave vibration with a longitudinal vibration with the drivers, the rotors are rotated relatively to the stator. Since the drivers are clamped with the integrated rotors, the ultrasonic motor can be driven with small frictional loss and improved conversion efficiency.

18 Claims, 24 Drawing Sheets

OPTICAL AXIS O SIDE

OPTICAL AXIS O SIDE

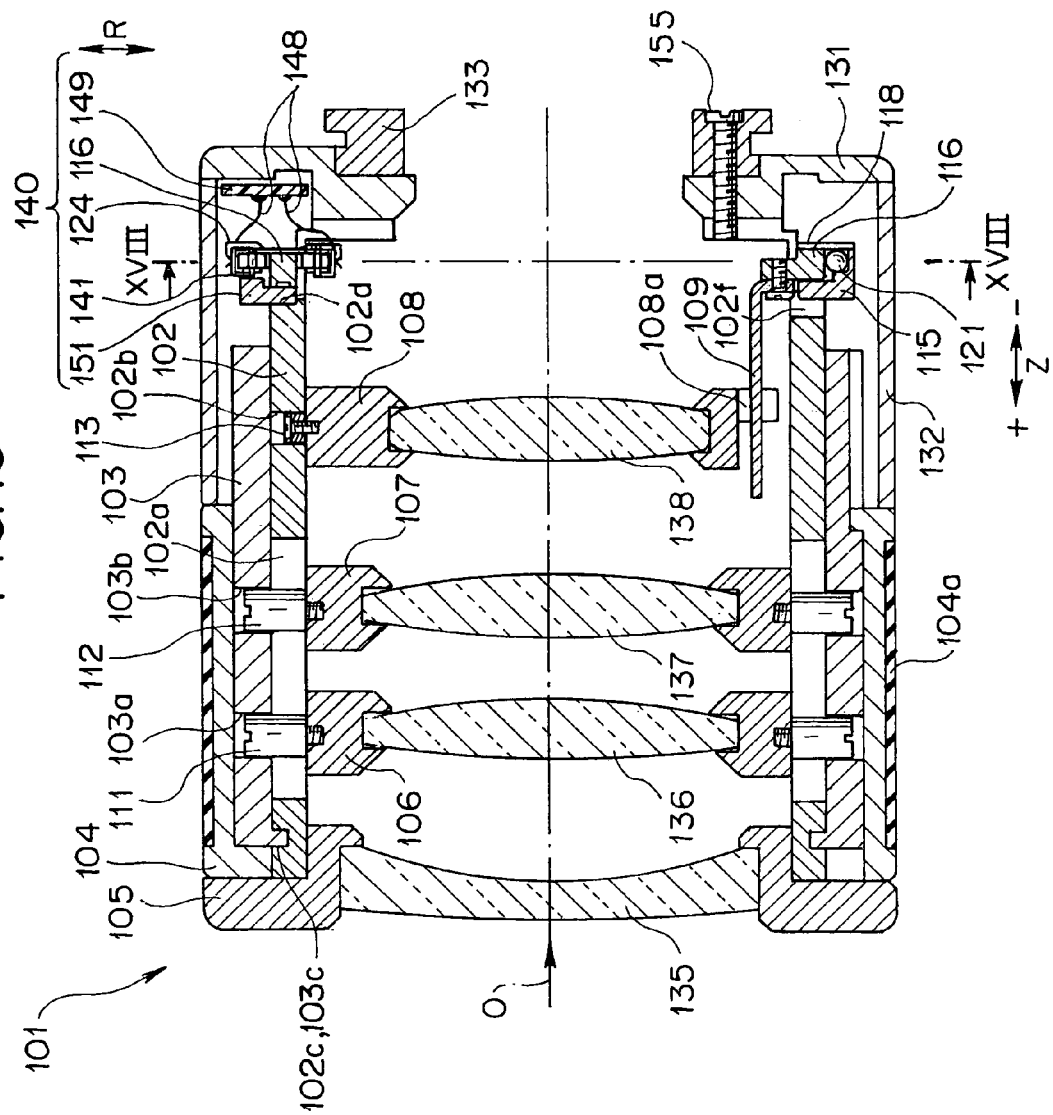

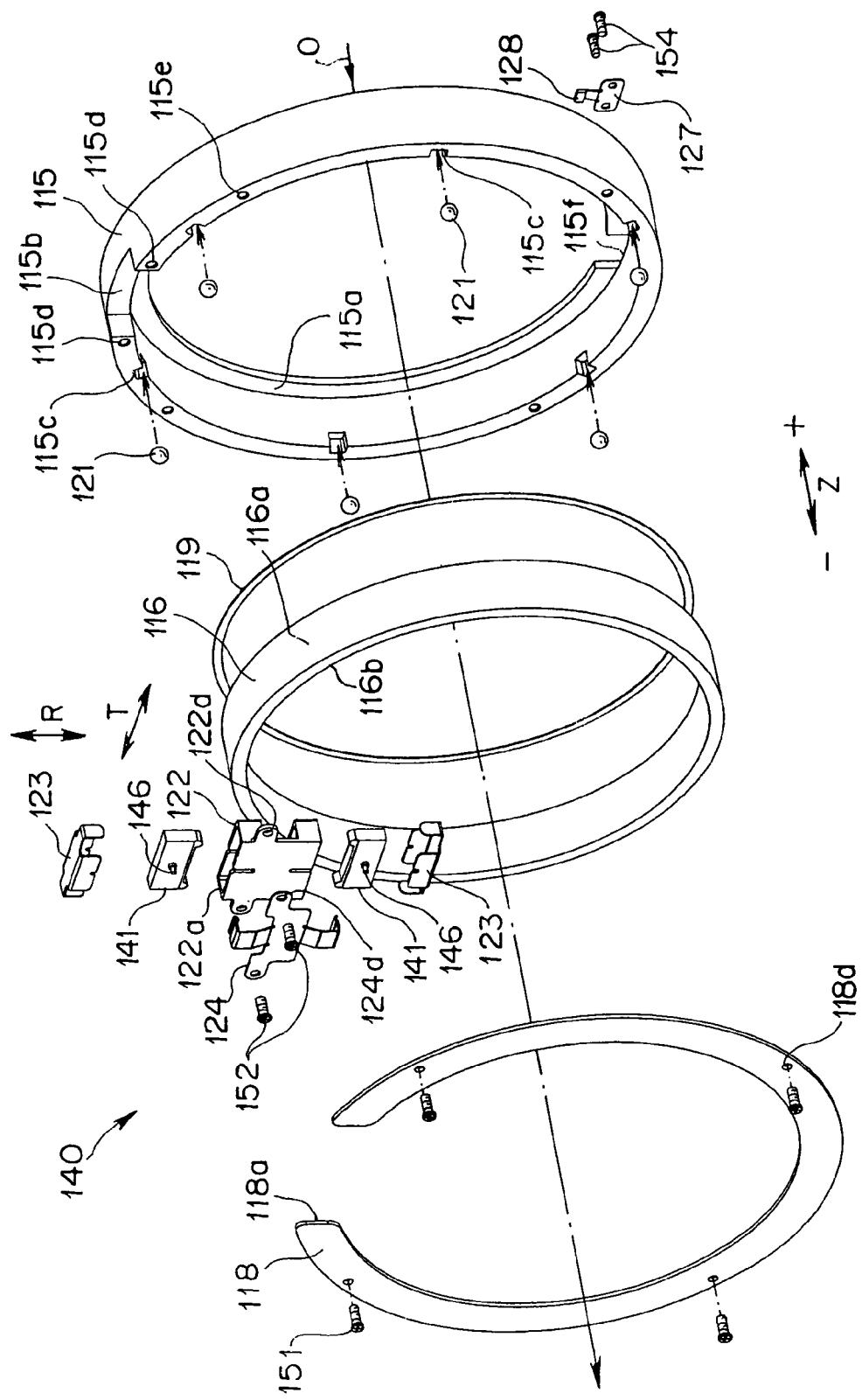

OPTICAL AXIS O SIDE

OPTICAL AXIS O SIDE

OPTICAL AXIS O SIDE

ULTRASONIC MOTOR

This application claims benefit of Japanese Applications No. 2004-142698 filed in Japan on May 12, 2004 and No. 2004-188748 filed in Japan on Jun. 25, 2004, the contents of which are incorporated by this reference.

BACKGROUND OF THE INVENTION

1. Field of the Invention

The present invention relates to an ultrasonic motor using a transducer exciting an elliptical movement produced by combining a bending standing-wave vibration with a longitudinal vibration.

2. Description of the Related Art

A linear ultrasonic motor that relatively moves a driven object by urging a transducer in contact with an elastic body, the transducer being composed of a piezoelectric element exciting an elliptical movement produced by combining a bending standing-wave vibration with a longitudinal vibration, is disclosed in Japanese Patent Publication No. 2871768 and Japanese Unexamined Patent Application Publication No. 8-182356.

A toroidal ultrasonic motor for driving a body of rotation proposed in Publication of Japanese Examined Patent Application No. 7-48087 is applicable to a lens barrel using free-traveling waves. The lens barrel includes a fixed cylinder, an ultrasonic motor composed of a stator and a range ring as a body of rotation, and a moving lens driven back and forth by the range ring.

Furthermore, a rotary ultrasonic motor disclosed in Japanese Patent Publication No. 3401097 includes a transducer exciting an ultrasonic elliptical vibration and a rotor having a shaft as the center of rotation.

SUMMARY OF THE INVENTION

An ultrasonic motor according to the present invention has a structure that is suitable for a drive source of bodies of rotation with small frictional loss and improved motor efficiency using a transducer exciting an ultrasonic elliptical movement.

According to a first aspect of the present invention, an ultrasonic motor includes at least one transducer exciting an elliptical movement produced by combining a bending standing-wave vibration with a longitudinal vibration; a support member for holding the transducer; a first body of rotation arranged rotatably about an axis in relation to the support member so as to be able to come in contact with one end of both ends of the transducer in the axial direction; a second body of rotation supported to the first body of rotation so as to rotate integrally with the first body of rotation and arranged rotatably about the axis as well as relatively to the support member so as to be able to come in contact with the other end of both ends of the transducer in the axial direction; and urging means for urging the first and second bodies of rotation in the axial direction so as to usually abut the transducer.

According to a second aspect of the present invention, an ultrasonic motor includes at least one transducer exciting an elliptical movement produced by combining a bending standing-wave vibration with a longitudinal vibration; a support member for holding the transducer; a first body of rotation arranged rotatably about an axis in relation to the support member so as to be able to come in contact with one of both ends of the transducer in the axial direction; a second body of rotation supported to the first body of rotation movably in the axial direction so as to rotate about the axis usually integrally with the first body of rotation as well as relatively to the support member so as to be able to come in contact with the other of both ends of the transducer in the axial direction; and urging member supported to rotate usually integrally with the first and second bodies of rotation for urging the second body of rotation in the axial direction so that the first and second bodies of rotation usually abut the transducer.

According to a third aspect of the present invention, an ultrasonic motor includes at least two transducers exciting an ultrasonic elliptical vibration; an annular rotor rotated relatively to the transducers by the effect of the elliptical vibration due to the transducers arranged at predetermined positions along a circumference; a stator for rotatably supporting the rotor, and supporting the two transducers so as to restrict their positions in a rotation axial direction and a circumferential direction, as well as supporting the two transducers movably in the radial direction of the rotor so that the two transducers oppose external and internal walls of the rotor in the radial direction perpendicular to the rotation axis of the rotor to be able to come in contact with the external and internal walls; and urging means for urging the two transducers in the radial direction of the rotor so that the two transducers usually come in pressure contact with the external and internal walls of the rotor in the radial direction perpendicular to the rotation axis of the rotor.

According to a fourth aspect of the present invention, an ultrasonic motor includes a pair of transducers exciting an ultrasonic elliptical vibration produced by combining a bending standing-wave vibration with a longitudinal vibration; an annular rotor rotated relatively to the transducers by the effect of the elliptical vibration due to the transducers arranged at predetermined positions along a circumference; a stator for rotatably supporting the rotor; a transducer holder fixed to the stator for holding the pair of transducers movably in the radial direction of the rotor by restricting the position of the rotor in the rotation axial direction and the circumferential direction at a neutral axial portion of the combined vibration; a transducer press member for supporting the pair of transducers at the neutral axial portion of the combined vibration relative to the transducer holder; and urging means for urging the pair of transducers with the transducer press member therebetween in the radial direction of the rotor so that the pair of transducers come close to each other, wherein the pair of transducers are structured to usually come in pressure contact with external and internal walls of the rotor in the radial direction perpendicular to the rotation axis of the rotor by clamping.

According to a fifth aspect of the present invention, an ultrasonic motor includes a pair of transducers exciting an ultrasonic elliptical vibration; an annular rotor clamped with the pair of transducers in the radial direction and rotated relatively to the transducers by the effect of the elliptical vibration due to the transducers; a stator for rotatably supporting the rotor; and a transducer holder fixed to the stator for holding the pair of transducers movably in the radial direction of the rotor so that the pair of transducers come close to each other by opposing each other.

According to a sixth aspect of the present invention, an ultrasonic motor includes a plurality of transducers exciting an ultrasonic elliptical vibration produced by combining a bending standing-wave vibration with a longitudinal vibration; an annular rotor rotated relatively to the transducers by the effect of the elliptical vibration due to the transducers arranged at predetermined positions along a circumference; a stator for rotatably supporting the rotor; a transducer holder fixed to the stator for holding the plurality of transducers movably in the radial direction of the rotor by restricting the position of the rotor in the rotation axial direction and the circumferential direction at a neutral axial portion of the combined vibration; a transducer press member for supporting the plurality of transducers at a neutral axial portion of the combined vibration relative to the transducer holder; and urging means for urging the plurality of transducers with the transducer press member therebetween in the radial direction of the rotor so that the plurality of transducers come close to each other, wherein the plurality of transducers are structured to usually come in pressure contact with external and internal walls of the rotor in the radial direction perpendicular to the rotation axis of the rotor by clamping.

Other features and advantages of the present invention will be apparent form the description below.

BRIEF DESCRIPTION OF THE DRAWINGS

FIG. 16 is a longitudinal sectional view, coinciding with an optical axis, of a lens barrel having an ultrasonic motor according to a second embodiment of the present invention mounted thereon;

FIG. 17 is an exploded perspective view of the ultrasonic motor mounted on the lens barrel of FIG. 16;

DESCRIPTION OF THE PREFERRED EMBODIMENTS

Embodiments of the present invention will be described below with reference to the drawings.

Figure 1:
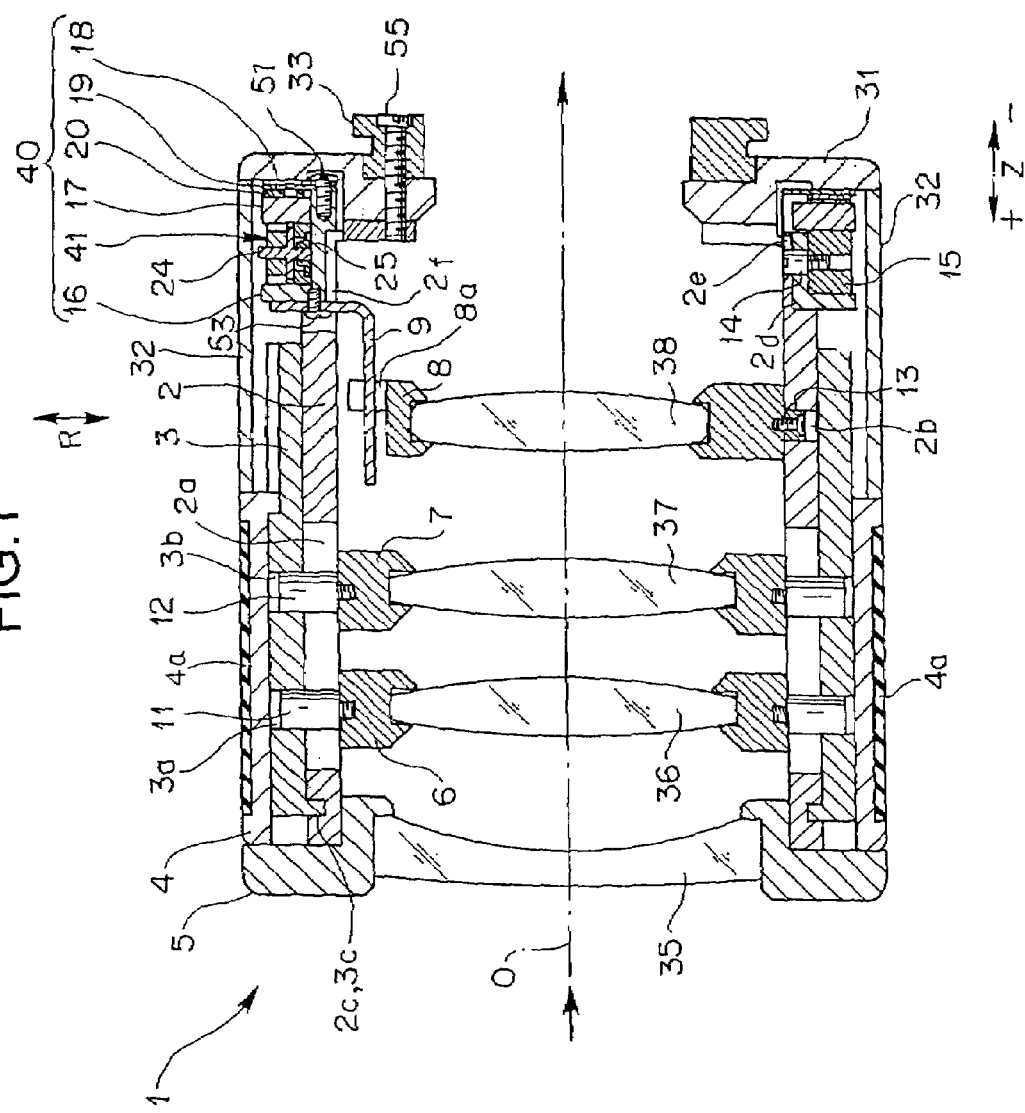
FIG. 1 is a longitudinal sectional view, along an optical axis, of a lens barrel having an ultrasonic motor according a first embodiment of the present invention mounted thereon.
Figure 2:
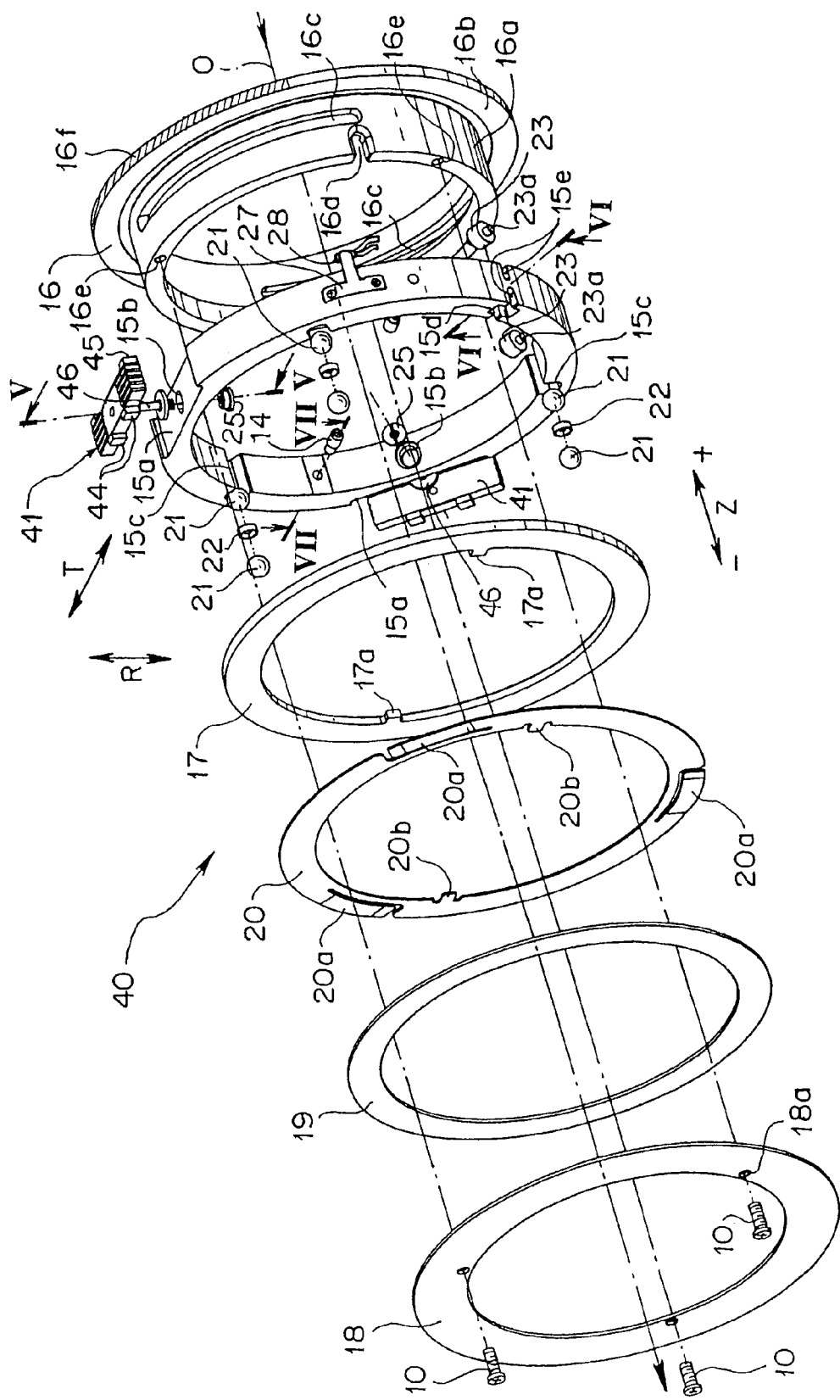
FIG. 2 is an exploded perspective view of the ultrasonic motor mounted on the lens barrel of FIG. 1.
Figure 3:
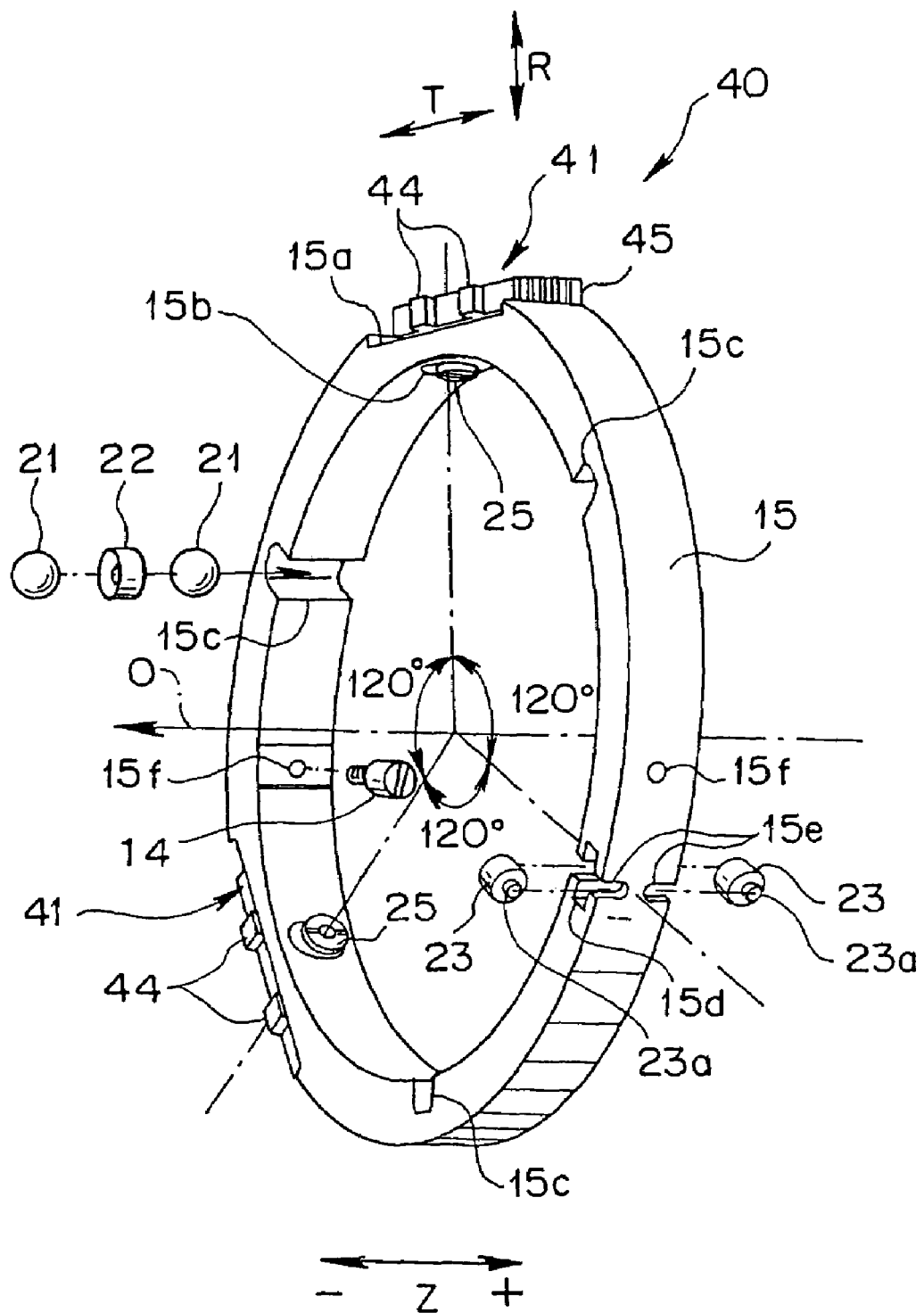
FIG. 3 is an exploded perspective view of a transducer and a stator of the ultrasonic motor of FIG. 2.
Figure 4:
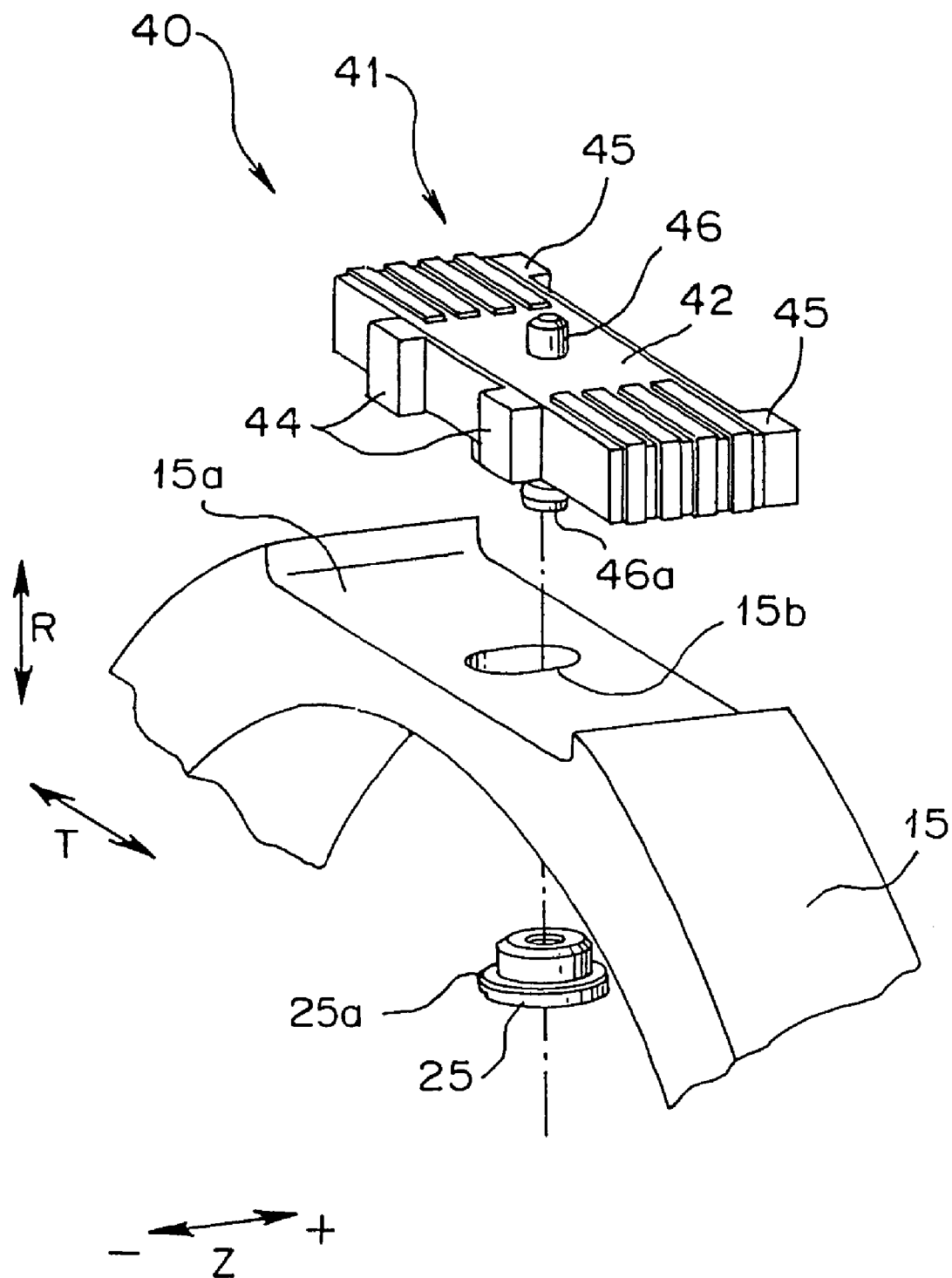
FIG. 4 is an exploded perspective view showing the transducer mounted on the stator in the ultrasonic motor of FIG. 2.
Figure 5:
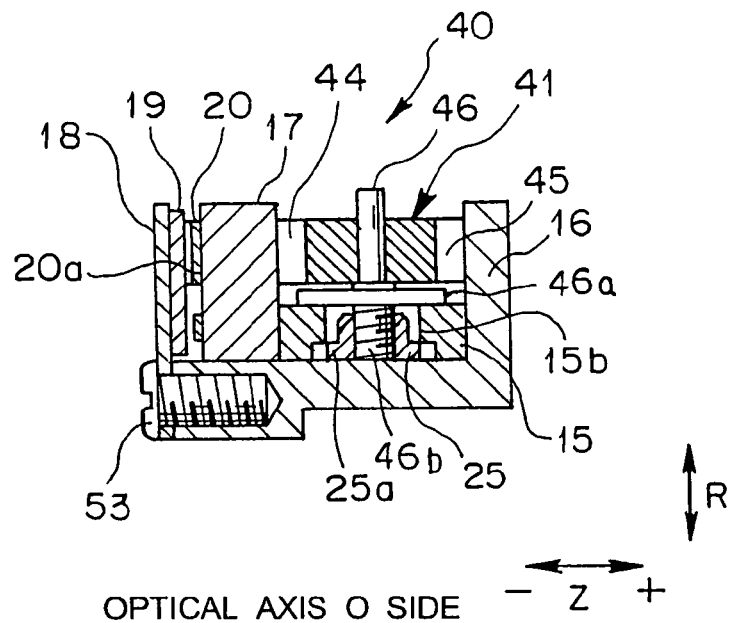
FIG. 5 is a sectional view at the line V-V of FIG. 2 showing the vicinity of the transducer.
Figure 6:
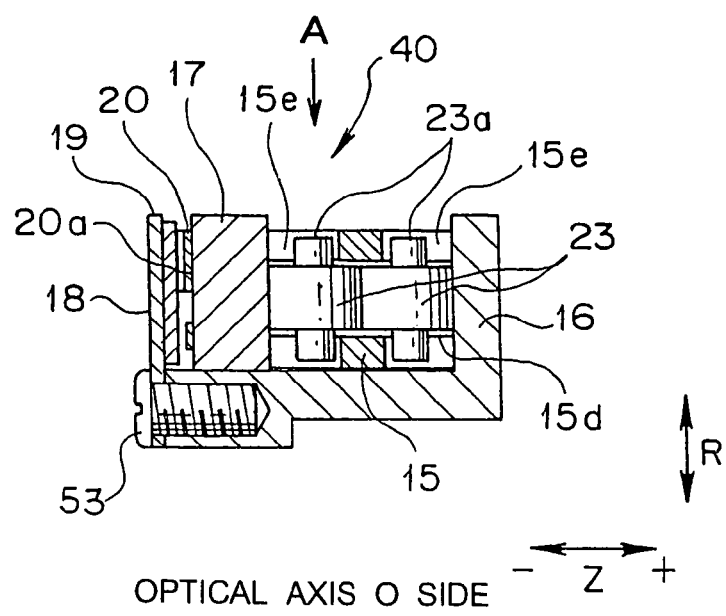
FIG. 6 is a sectional view at the line VI-VI of FIG. 2 showing a cross-section of the vicinity of rollers.
Figure 7:
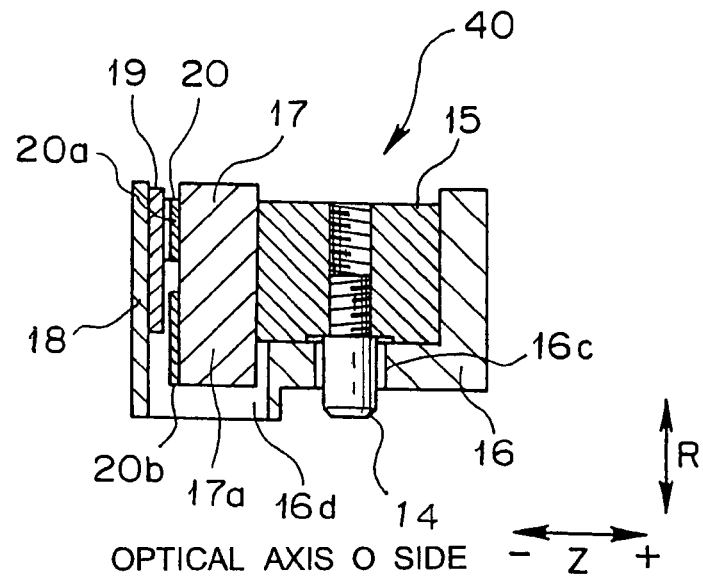
FIG. 7 is a sectional view at the line VII-VII of FIG. 2 showing a section of the vicinity of a connection pin.
Figure 8:
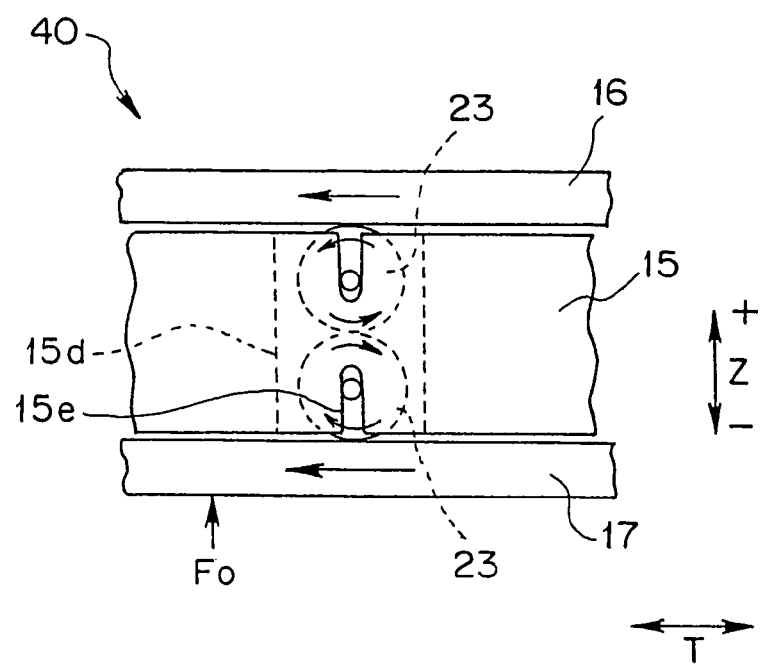
FIG. 8 is a drawing viewed in arrow A direction of FIG. 6 showing the contact between the rollers.

FIG. 1 is a longitudinal sectional view, along an optical axis, of a lens barrel having an ultrasonic motor according a first embodiment of the present invention mounted thereon; FIG. 2 is an exploded perspective view of the ultrasonic motor; FIG. 3 is an exploded perspective view of a transducer and a stator of the ultrasonic motor; FIG. 4 is an exploded perspective view showing the transducer mounted on the stator; FIG. 5 is a sectional view at the line V-V of FIG. 2 showing the vicinity of the transducer; FIG. 6 is a sectional view at the line VI-VI of FIG. 2 showing a cross-section of the vicinity of rollers; FIG. 7 is a sectional view at the line VII-VII of FIG. 2 showing a section of the vicinity of a connection pin; and FIG. 8 is a drawing viewed in arrow A direction of FIG. 6 showing contact between the rollers.

In the description below, the optical axis of a photographing lens composed of first to fourth lens groups is denoted as the optical axis O; the direction parallel with the optical axis O is denoted as the direction Z, in which symbol + denotes the object side, and symbol − denotes the focus side. The radial direction about the optical axis O is denoted as the direction R; and the tangential direction to a circumference of the optical axis O is denoted as the direction T. In addition, the optical axis O substantially agrees with the rotation shaft center of the stator and the rotor (below-mentioned).

A lens barrel 1 according to the embodiment, as shown in FIG. 1, includes a fixed frame 2, a cam ring 3 supported on the external surface of the fixed frame 2, a zoom ring 4 fitted onto the circumference of the cam ring 3, a first group lens frame 5 holding a first lens group 35, a second group lens frame 6 located in the rear of the first group lens frame 5 for holding a second lens group 36, a third group lens frame 7 located in the rear of the second group lens frame 6 for holding a third lens group 37, a fourth group lens frame 8 located in the rear of the third group lens frame 7 for holding a fourth lens group 38 that is a focus lens, and an ultrasonic motor 40 as a drive source.

The fixed frame 2 is an annular frame member, and has at the annular part a circumferential guide groove 2c, a linear guide groove 2a arranged along the direction Z, a cam groove 2b slanting to the direction Z, and further has on the back end an outer circumference 2d for fitting the rotor of the ultrasonic motor therewith, a connection groove 2e arranged along the direction Z, and a notch 2f for inserting a focus drive arm. The fixed frame 2 is integrated on the rear end face into an end plate 31, a mount 33, by a screw 55. To the end plate 31, an external frame 32 is firmly fixed.

The cam ring 3 is an annular frame member, and is rotatably fitted onto the circumference of the fixed frame 2. Furthermore, an internal projection 3c is fitted into the circumferential guide groove 2c so as to be rotatably supported on the fixed frame 2 in a restricted state in the direction Z. The cam ring 3 is provided with two cam grooves 3a and 3b slanting to the direction Z.

The zoom ring 4 is an annular frame member, and is fitted onto the circumference of the cam ring 3 integrally in both the directions Z and T. On the circumference of the zoom ring 4, a grabbing rubber ring 4a is stuck.

The first group lens frame 5 is fixed on the front end of the fixed frame 2.

The second and third group lens frames 6 and 7 are fitted into the fixed frame 2, and are provided with cam followers 11 and 12 fixed on their circumferences, respectively. The cam followers 11 and 12 are inserted into the linear guide groove 2a of the fixed frame 2 so as to be thereby guided, and are slidably fitted into the cam grooves 3a and 3b of the cam ring 3, respectively. Thus, when the cam ring 3 is rotated by the zoom rotation of the zoom ring 4, the second and third group lens frames 6 and 7 move back or forth along the optical axis O by the cam grooves 3a and 3b via the cam followers 11 and 12, respectively, so as to move to the respective zoom positions.

The fourth group lens frame 8 is fitted into the fixed frame 2, and is provided with cam followers 13 fixed on its circumference. The cam followers 13 are slidably fitted into the cam groove 2b of the fixed frame 2. The fourth group lens frame 8 is provided with a guide groove 8a arranged along the direction Z. The distal end of a focus drive arm 9 is slidably fitted into the guide groove 8a. The focus drive arm 9 is fixed to a rotor 16 of the ultrasonic motor 40. Thus, when the rotor 16 of the ultrasonic motor 40 is rotated during focus driving, the fourth group lens frame 8 is rotated relatively to the fixed frame 2 via the focus drive arm 9. By the rotation, the cam followers 13 slide through the cam groove 2b so that the rotating fourth group lens frame 8 moves along the optical axis O to the focus position.

The ultrasonic motor 40 is the same as an actuator composed of an ultrasonic motor for driving the fourth group lens frame 8 for focusing and, as shown in FIGS. 1 and 2, it includes a stator 15 as a support member, the rotor 16 as a first body of rotation, a rotor 17 as a second body of rotation, a transducer (vibrator) 41 exciting an elliptical movement produced by combining a bending standing-wave vibration with a longitudinal vibration, a pair of rollers 23 as rotating spacer members, three pairs of bearing balls 21, an urging leaf spring 20 as an urging member, a spring press plate 18, a spacer plate 19 for adjusting a springing force, a sensor support plate 27, and a magnetic sensor 28.

The rotor 16 is an annular member made of a hardwearing material, and it includes a circular ring 16a and a flange 16b arranged in the side of the direction +Z. The circular ring 16a is provided with two clearance grooves 16c formed along the peripheral direction, two notches 16d formed from the −Z side, and screw holes 16e formed on the end face on the −Z side. The flange 16b is provided with a magnetic film portion 16f formed at a predetermined position on the circumference for a magnetic encoder and screw holes formed on the end face on the +Z side for fixing a drive arm.

The rotor 17 is a ring-shaped member made of a hardwearing material, and is provided with two projections 17a formed to protrude inside.

The urging leaf spring 20 is made of a ring-shaped spring plate, and is provided with three elastic deformation portions 20a formed by cutting-up the plate and capable of elastically deforming in the axial direction, and two projections 20b formed to protrude inside.

The ring-shaped spring press plate 18 includes screw insertion holes 18a.

The ring-shaped stator 15, as shown in FIGS. 2 and 3, is provided with two recesses 15a formed on the circumference for attaching a transducer thereto, through-elongated holes 15b slightly elongated in the direction Z and formed at the center of the recess 15a so as to pass through in the direction R, a roller insertion pass-through groove 15d formed along the direction Z, notches 15e cut from both ends of the pass-through groove 15d, and three ball guide grooves 15c formed along the direction Z and opened inside.

The pair of rollers 23, as shown in FIGS. 2 and 8, are inserted into the roller insertion pass-through groove 15d in a state in which a shaft 23a of the rollers 23 is rotatably fitted into the notches 15e. In the inserted state, both the rollers inside abut each other, and the external surfaces of both the rollers slightly protrude from both the end faces of the stator 15 from the direction Z. Both the rollers 23 are movable in the direction Z. The number of the rollers 23 is not limited to a pair but may be even numbered. This is because the rollers are allowed to make rolling contact when they abut the rotating rotors 16 and 17 as will be described later.

The three pairs of the balls 21, as shown in FIG. 3, are fitted into the ball guide grooves 15c with retainers 22 therebetween. The external surface of the ball very slightly protrudes inside the stator 15 so that the rotor 16 is rotated relatively to the stator 15 interposing the balls 21 therebetween when the stator 15 is fitted onto the circumference of the rotor 16.

The sensor support plate 27 for the magnetic sensor 28 is fixed to the circumference of the stator 15 with screws. In this state, the magnetic sensor 28 is brought into sliding contact with the magnetic film portion 16f of the rotor 16 so as to detect a rotation angle of the rotor 16.

The two transducers 41 constitute a drive unit of the ultrasonic motor 40, and as shown in FIG. 4, each includes a multilayer piezoelectric transducer 42, drivers 44 and 45, and a support shaft 46.

The support shaft 46, as shown in FIG. 5, includes a penetration shaft, a flange 46a, and a screw 46b provided at the flange end. The penetration shaft penetrates the multilayer piezoelectric transducer 42 in the laminating direction through a node position (neutral position) of the vibration of the multilayer piezoelectric transducer 42 so as to be bonded.

The drivers 44 and 45, as shown in FIG. 4, are arranged in a direction perpendicular to the support shaft 46 as well as along the longitudinal direction (the direction T) of both end faces of the multilayer piezoelectric transducer 42 in the direction Z so as to constitute respective pairs of projections. The drivers 44 and 45 slightly protrude from the end face of the stator 15 in the direction Z in a stator-mounted status. The distance between the drivers 44 and 45 is the same as the sum of diameters of the two rollers 23.

For attaching the two transducers 41 to the stator 15, the transducer 41 is first inserted into the recess 15a from outside, and the screw 46b of the support shaft 46 is inserted into the through-elongated hole 15b. Then, a nut 25 is screwed with the screw 46b from inside so as to bond the screw 46b in a state in which the through-elongated hole 15b is clamped between the flange 46a of the support shaft 46 and a flange 25a of the nut 25. The transducers 41 attached to the stator 15 are rotatably supported about the support shaft 46 while being slightly movable relative to the stator 15 in the direction Z. However, the transducers 41 are positionally restricted in the directions T and R. In the peripheral direction of the stator 15, as shown in FIG. 3, at positions where the angle about the axis is divided into three equal angles of 120°, the two transducers 41 and the pair of rollers 23 are arranged, respectively.

In addition, more detailed structure of the transducer 41 and its effect will be described later.

As described above, the stator 15 having the transducers 41, the rollers 23, and the bearing balls 21 mounted thereon is fitted onto the circumference of the rotor 16 from the −Z side. The rotation of the stator 15 relative to the rotor 16 in the fitted state is restricted by fitting the projections 17a of the rotor 17 and the projections 20b of the urging leaf spring 20 into the notches 16d of the rotor 16 from the −Z side, respectively. Moreover, the spacer plate 19 for adjusting a springing force with a thickness corresponding to a demand is inserted so as to make the spring press plate 18 to abut thereto from the behind, so that the stator 15 is fixed to the rotor 16 by screwing screws 10, which are inserted into the screw insertion holes 18a, with the screw holes 16e of the rotor 16. Thereby, the rotors 16 and 17 are connected by cramping the stator 15 therebetween in a slightly slidable state in the direction Z while being restricted in relative rotation.

In the ultrasonic motor 40 assembled as described above, the rotor 16 comes in contact with the internal circumference of the stator 15 with the balls 21 therebetween in a state integrated into the rotor 17 so as to be relatively rotatably supported. The rotor 17 is urged by an urging force F0 of the urging leaf spring 20 toward the stator 15 in the direction +Z, and is supported relatively movably in the direction Z to the rotor 16 in an integrated rotation state with the rotor 16 (FIG. 8).

As shown in the sections of the transducer 41 and the rollers 23 in a clamped state in FIGS. 5 and 6, the drivers 44 and 45 and the pair of rollers 23 are clamped on their external surfaces with the integrated rotors 16 and 17 in the direction Z. The two transducers 41 and the pair of rollers 23, as shown in FIG. 3, are arranged at positions where the circumference of the stator 15 is divided into three equal parts, respectively, so as to be supported slightly movable in the direction Z. Thereby, the drivers 44 and 45 of the transducer 41 and the pair of rollers 23 are clamped with the integrated rotors 17 and 16 therebetween by receiving the substantially uniform urging force F0 in the direction Z.

The ultrasonic motor 40 constructed as described above is assembled in the lens barrel 1 by rotatably fitting the internal circumference of the rotor 16 onto the outer circumference 2d in the rear fixed frame 2. During the assembling, a connection pin 14 (FIG. 7), which is screwed into the internal circumference of the stator 15 by inserting it into the clearance groove of the rotor 16, is fitted into the connection groove 2e of the fixed frame 2 from the −Z side. With the connection pin 14, the stator 15 is supported to the fixed frame 2 in an integrated state in the rotational direction. The rotors 16 and 17 are supported rotatably on the outer circumference 2d of the fixed frame 2. However, the position of the rotor 16 in the direction Z is restricted in a state in which the spring press plate 18 and the rotor 16 are clamped with a rear step of the fixed frame 2 and the end plate 31 therebetween. Also, the focus drive arm 9 is attached on the end face of the rotor 16 in the +Z side with screws 53, while the distal end of the focus drive arm 9 is slidably fitted into the guide groove 8a of the fourth group lens frame 8.

When the ultrasonic motor 40 is assembled in the lens barrel 1, upon driving the transducer 41 so as to excite an elliptical vibration, the rotors 16 and 17, which are abutted by the drivers 44 and 45, respectively, are rotated relative to the stator 15 (the fixed frame 2) so that the fourth group lens frame 8 is rotated via the focus drive arm 9. By this rotation, the fourth group lens frame 8 is driven along the cam groove 2b of the fixed frame 2 so as to move to the focus position in the optical axial direction O.

The configuration and effects of the transducer 41 herein will be described with reference to FIGS. 9 to 15D.

Figure 9:
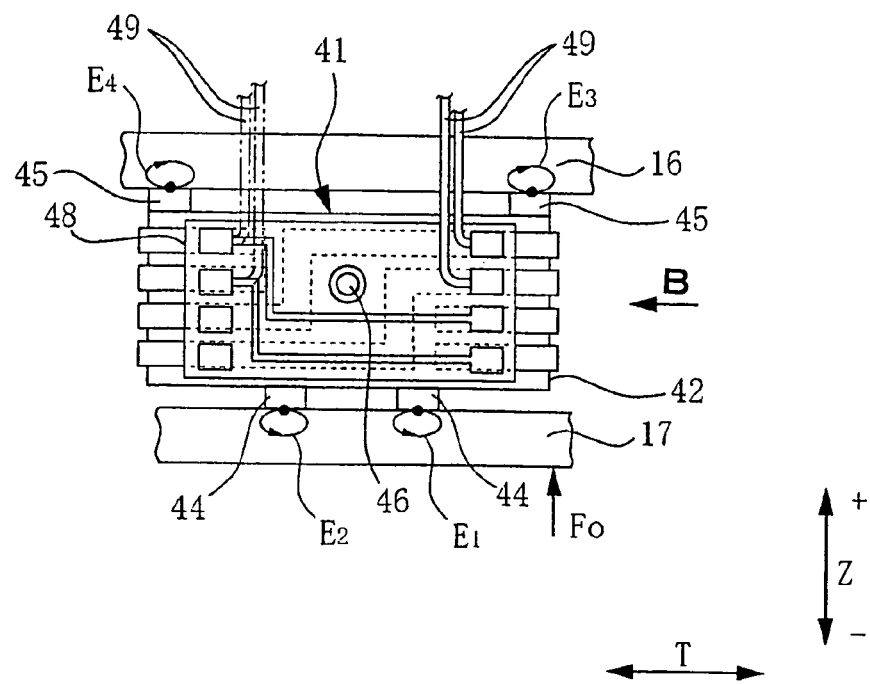
FIG. 9 is a drawing of the transducer of FIG. 3 having a flexible printed circuit board fixed thereto viewed from a support shaft.
Figure 10:
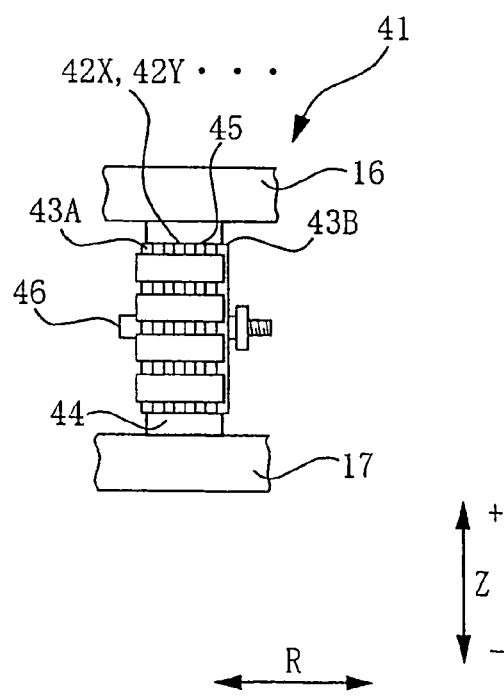
FIG. 10 is a drawing viewed in arrow B direction of FIG. 9.
Figure 11:
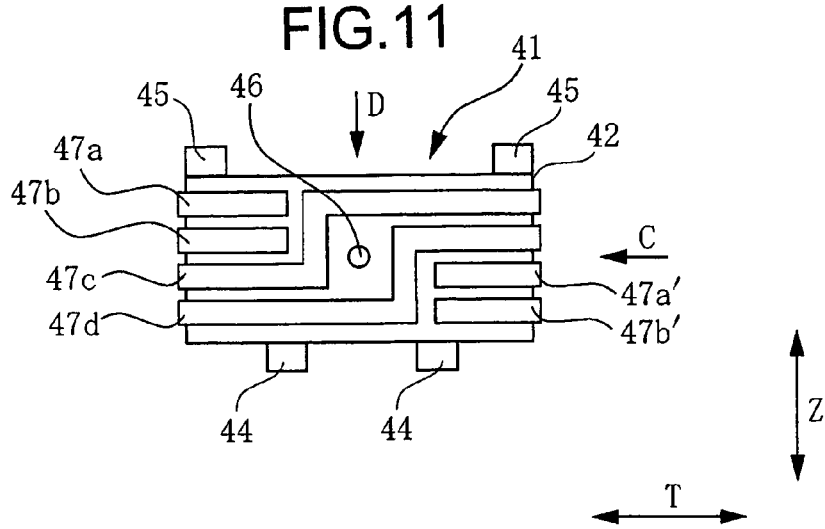
FIG. 11 is a drawing of a state in which the flexible printed circuit board is removed from the transducer in FIG. 9 and which is viewed from the support shaft.
Figure 12:
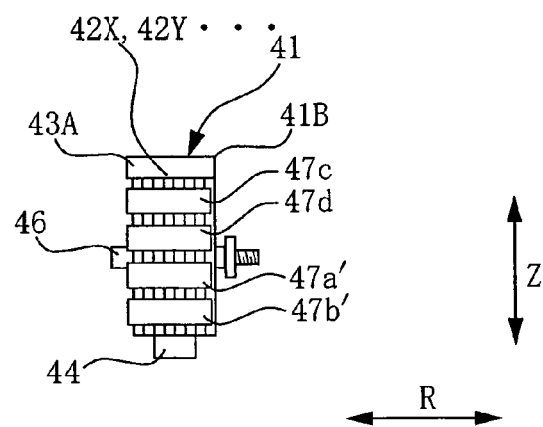
FIG. 12 is a drawing viewed in arrow C direction of FIG. 11.
Figure 13:
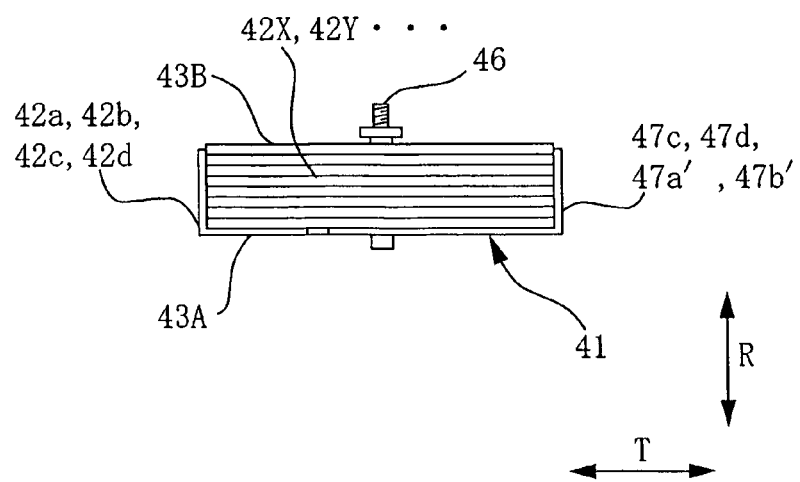
FIG. 13 is a drawing viewed in arrow D direction of FIG. 11.
Figure 14:
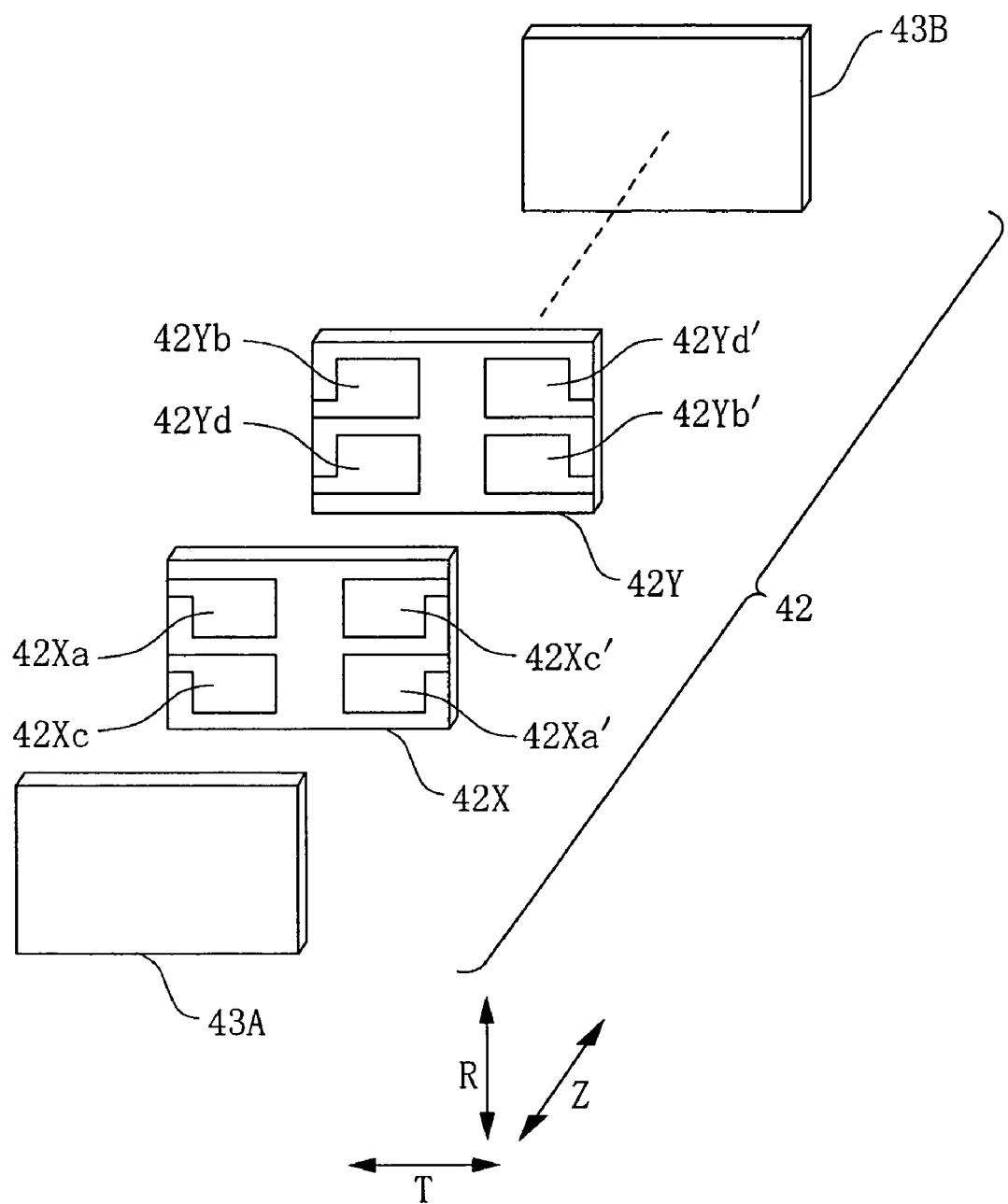
FIG. 14 is an exploded perspective view of a piezoelectric element and an insulation board constituting the transducer of FIG. 11 before a baking process.
Figure 15A:
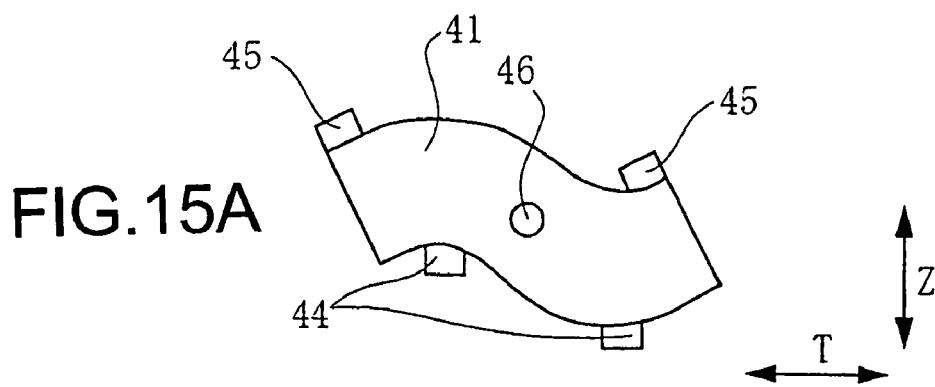
FIG. 15A shows a bending state in the composite vibration of the bending standing-wave vibration combined with the longitudinal vibration of the transducer of FIG. 11.
Figure 15B:
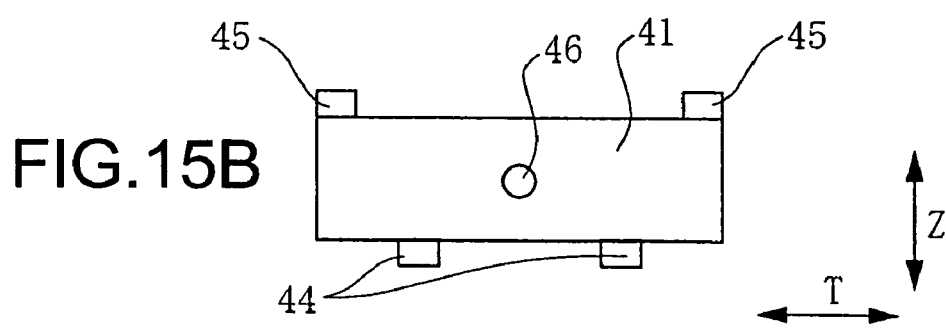
FIG. 15B shows an elongated state after the state of FIG. 15A in the composite vibration of the bending standing-wave vibration combined with the longitudinal vibration of the transducer of FIG. 11.
Figure 15C:
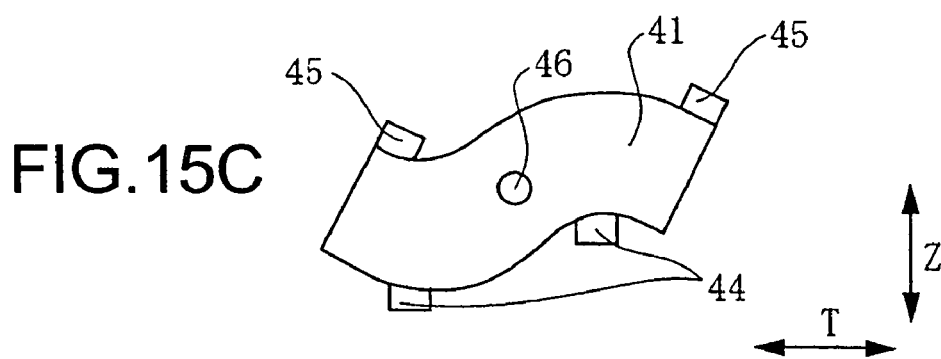
FIG. 15C shows a bending state after the state of FIG. 15B in the composite vibration of the bending standing-wave vibration combined with the longitudinal vibration of the transducer of FIG. 11.
Figure 15D:
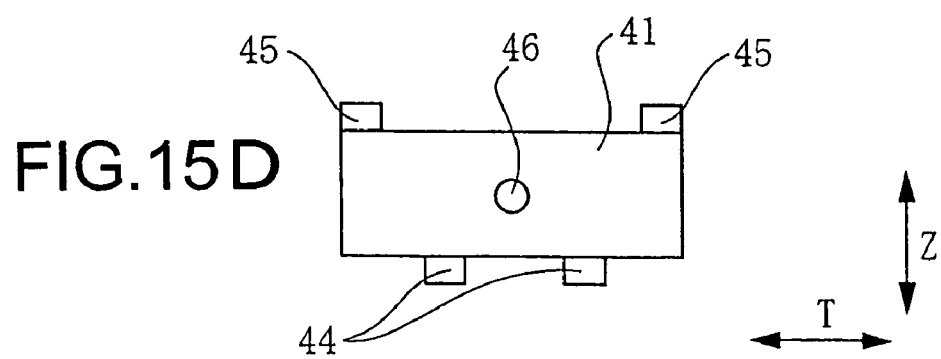
FIG. 15D shows a contraction state after the state of FIG. 15C in the composite vibration of the bending standing-wave vibration combined with the longitudinal vibration of the transducer of FIG. 11.

FIG. 9 is a drawing of the transducer 41 having a flexible printed circuit board 48 fixed thereto viewed from the support shaft; FIG. 10 is a drawing viewed in arrow B direction of FIG. 9; FIG. 11 is a drawing of a state in which the flexible printed circuit board 48 is removed from the transducer 41 in FIG. 9 viewed from the support shaft; FIG. 12 is a drawing viewed in arrow C direction of FIG. 11; FIG. 13 is a drawing viewed in arrow D direction of FIG. 11; FIG. 14 is an exploded perspective view of a piezoelectric element and an insulation board constituting the transducer 41 before a baking process; and FIGS. 15A to 15D are drawings of the composite vibration of the bending standing-wave vibration combined with the longitudinal vibration of the transducer 41 sequentially showing deformation states from a bending state of FIG. 15A, an elongated state of FIG. 15B, a bending state of FIG. 15C, to a contraction state of FIG. 15D.

The transducer 41 constituting the ultrasonic motor 40, as shown in FIGS. 11 and 14, includes a plurality of piezoelectric sheets of two kinds 42X and 42Y, the multilayer piezoelectric transducer 42 composed of two insulation plates 43A and 43B, electrodes 47a, 47b, 47c, 47d, 47a', and 47b' made of conductive silver paste, the one support shaft 46, a pair of the drivers 44, and a pair of drivers 45.

The respective two-kind piezoelectric sheets 42X and 42Y are composed of a rectangular piezoelectric element with a thickness of about 100 μm. The piezoelectric sheet 42X is provided with first internal electrodes 42X*a*, 42X*c*, 42X*c'*, and 42X*a'* coated with a silver/palladium alloy with a thickness of about 10 μm so as to be divided into four insulated regions applied on the front surface. The upper end of each internal electrode extends to the end face of the piezoelectric element in the longitudinal direction (direction T) (FIG. 14).

On the other hand, the piezoelectric sheet 42Y is provided with second internal electrodes 42Y*b*, 42Y*d*, 42Y*d'*, and 42Y*b'* coated with a silver/palladium alloy with a thickness of about 10 μm so as to be divided into four insulated regions applied on the front surface. The lower end of each internal electrode extends to the end face of the piezoelectric element in the longitudinal direction (direction T) (FIG. 14).

The first internal electrodes 42X*a*, 42X*c*, 42X*c'*, and 42X*a'* and the second internal electrodes 42Y*b*, 42Y*d*, 42Y*d'*, and 42Y*b'* of the respective piezoelectric sheets 42X and 42Y adjacent to each other are the same in shape while being upside down in electrode-end shape so that the rectangular electrode surfaces are overlapped with each other when the piezoelectric sheets are deposited. The two-kind piezoelectric sheets 42X and 42Y having such internal electrodes are alternately deposited so as to have about 40 layers in total.

As shown in FIG. 14, the deposited piezoelectric element is provided with an internal electrode exposed portion (not shown) formed on the left end face so as to expose ends of the first internal electrodes 42X*a* and 42X*c* and the second internal electrodes 42Y*b* and 42Y*d* in a deposited state. The deposited piezoelectric element is also provided with an internal electrode exposed portion (not shown) formed on the right end face so as to expose ends of the first internal electrodes 42X*c'* and 42X*a'* and the second internal electrodes 42Y*d'* and 42Y*b'* in a deposited state. Furthermore, on both side faces of the internal electrode exposed portions, external electrodes made of silver paste, four in total, are independently formed so as to be conductive to the internal electrodes (FIG. 12).

On the front and rear surfaces of the deposited piezoelectric element, insulation plates 43A and 43B with the same rectangular shape as that of the piezoelectric sheets 42X and 42Y are arranged, respectively, so as to constitute the multilayer piezoelectric transducer 42. On the surface of the front insulation plate 43A, electrodes 47a, 47b, 47c, 47d, 47a', and 47b' made of conductive silver paste are formed as shown in FIG. 11.

The electrodes 47a, 47b, 47c, 47d, 47a', and 47b' on the insulation plate 43A are electrically connected to the deposited both-side internal electrodes exposed to both sides for every layered piezoelectric sheets, respectively. That is, to the electrode 47a, the first internal electrode 42X*a* is electrically connected; to the electrode 47b, the second internal electrode 42Y*b* is electrically connected; to the electrode 47c, the first internal electrode 42X*c* and the first internal electrode 42X*c'* are electrically connected; to the electrode 47d, the second internal electrode 42Y*d* and the second internal electrode 42Y*d'* are electrically connected; to the electrode 47a', the first internal electrode 42X*a'* is electrically connected; and to the electrode 47b', the second internal electrode 42Y*b'* is electrically connected.

When the multilayer piezoelectric transducer 42 having the insulation plates 43A and 43B overlapped thereon is baked on the deposited piezoelectric sheets 42X and 42Y in the electrode-connection state so as to polarize the multilayer piezoelectric transducer 42 using the above-mentioned electrodes, it becomes the transducer 41.

At both the intermediate positions (anti-node positions of the bending standing-wave vibration) between the vibration neutral point on the end face in the +Z side (the direction perpendicular to the depositing direction) of the transducer 41 (the multilayer piezoelectric transducer 42) and both the ends of the transducer 41, a pair of the drivers 44 are bonded, respectively. Also, at both end positions in the direction T on the end face in the −Z side (the direction perpendicular to the depositing direction), a pair of the drivers 45 are bonded, respectively. In addition, both the drivers 44 and 45 are formed by dispersing alumina in a high polymeric material.

Furthermore, at the substantial center of the transducer 41, which is the vibration neutral point (node position), a through-hole is formed in the depositing direction (the direction R). The pass-through shaft portion made of stainless steel or the like of the support shaft 46 is penetrated through the through-hole in the direction R so as to be bonded (FIG. 12).

On the electrodes 47a, 47b, 47c, 47d, 47a', and 47b' provided on the insulation plate 43A of the transducer 41, flexible connection cables having a connection pattern (referred to as an FPC (flexible printed circuit) below) are mounted in a connected state to the respective electrodes. To the connection pattern, lead wires 49 are connected for applying drive voltage (FIG. 9). The lead wires 49 are connected to a transducer drive circuit.

The transducer drive circuit includes an oscillation circuit, a phase-shift circuit, and a drive circuit, and it applies the phase-controlled drive voltage to the transducer 41 via the drive circuit.

The transducer 41 is driven by the drive voltage so as to generate the composite vibration of the bending standing-wave vibration combined with the longitudinal vibration shown in FIGS. 15A to 15D. Thereby, out of phase elliptical vibrations (trajectories E1, E2, E3, and E4 shown in FIG. 9) are generated at distal ends of the drivers 44 and 45. Since at the distal ends of the drivers 44 and 45, the rotors 16 and 17, which are driven objects, are urged, respectively, the integrated rotors 16 and 17 are rotated relative to the stator 15 via the drivers 44 and 45 in the rotational direction of the elliptical vibration.

In the lens barrel 1 constructed as described above, upon focus driving, when the transducer 41 is driven by the transducer drive circuit so that the drivers 44 and 45 are vibrated along elliptical trajectories, the integrated rotors 16 and 17 are rotated relatively to the stator 15 and the fixed frame 2 in any direction. By the rotation of the rotors, the fourth group lens frame 8 is rotated via the focus drive arm 9 so as to move to the focus position in the optical axial direction 0 along the cam groove 2*b* of the fixed frame 2.

As described above, the ultrasonic motor 40 assembled in the lens barrel 1 according to the embodiment has a structure preferable for a drive source of an object of rotation with small frictional loss and improved motor efficiency. That is, in the above-mentioned ultrasonic motor 40, the two transducers 41 and the pair of rollers 23 are arranged at positions where the circumference of the stator 15 is divided into three equal parts, respectively, and they are clamped with the integrated rotors 16 and 17 by an urging force F0. Accordingly, the rotors 16 and 17 are driven in a state in which an unbalanced force is not applied thereto as well as the frictional loss due to the urging force F0 is difficult to be produced.

According to the embodiment described above, a structure is adopted in which the two transducers 41 and the pair of rollers 23 are arranged at positions where the circumference of the stator 15 is divided into three equal parts, respectively; alternatively, the transducer may be arranged in at least one position while the rollers may be arranged at other positions where the circumference of the stator 15 is divided into a plurality of equal parts, or the transducers may also be arranged at the entire positions.

Also, the transducer 41 according to the embodiment has a rectangular shape; alternatively, it may have a circular arc shape along the peripheral direction of the stator 15.

According to the embodiment, the pair of rollers 23 are incorporated as spacer members; alternatively, a pair of balls may be applied.

Next, a lens barrel having an ultrasonic motor according to a second embodiment of the present invention assembled therein will be described with reference to FIGS. 16 to 23.

Figure 18:
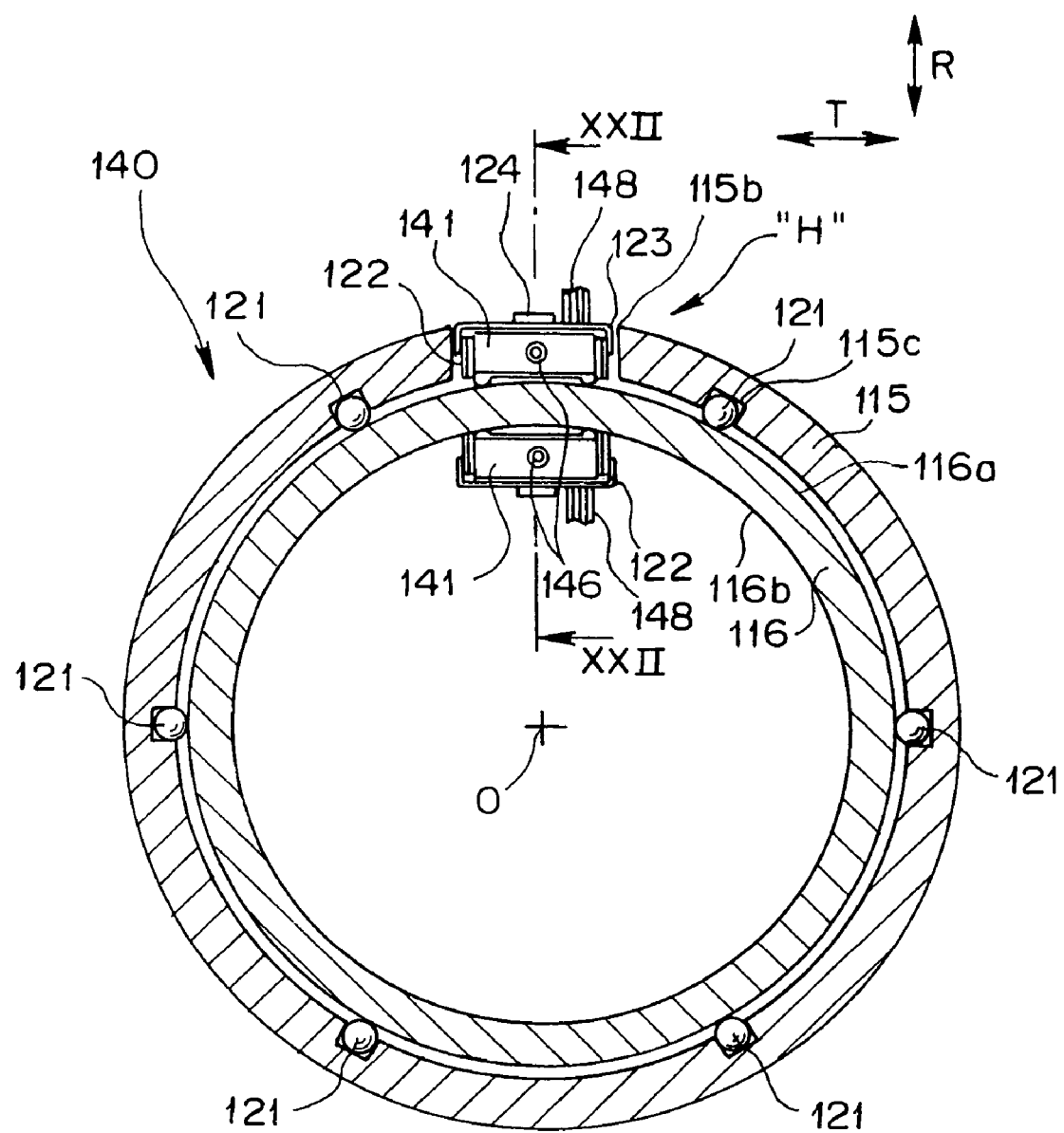
FIG. 18 is a cross-sectional view at the line XVIII-XVIII of FIG. 16.
Figure 19:
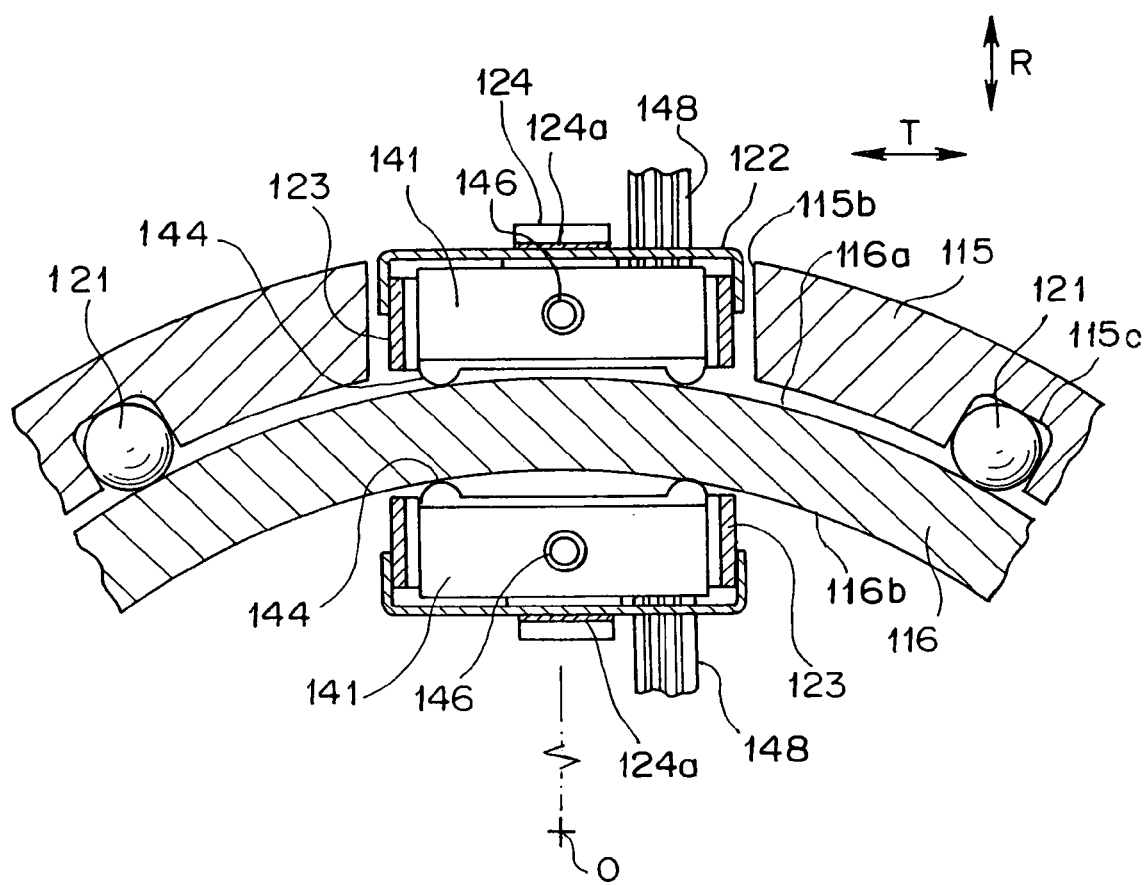
FIG. 19 is an enlarged view of H portion of FIG. 18.
Figure 20:
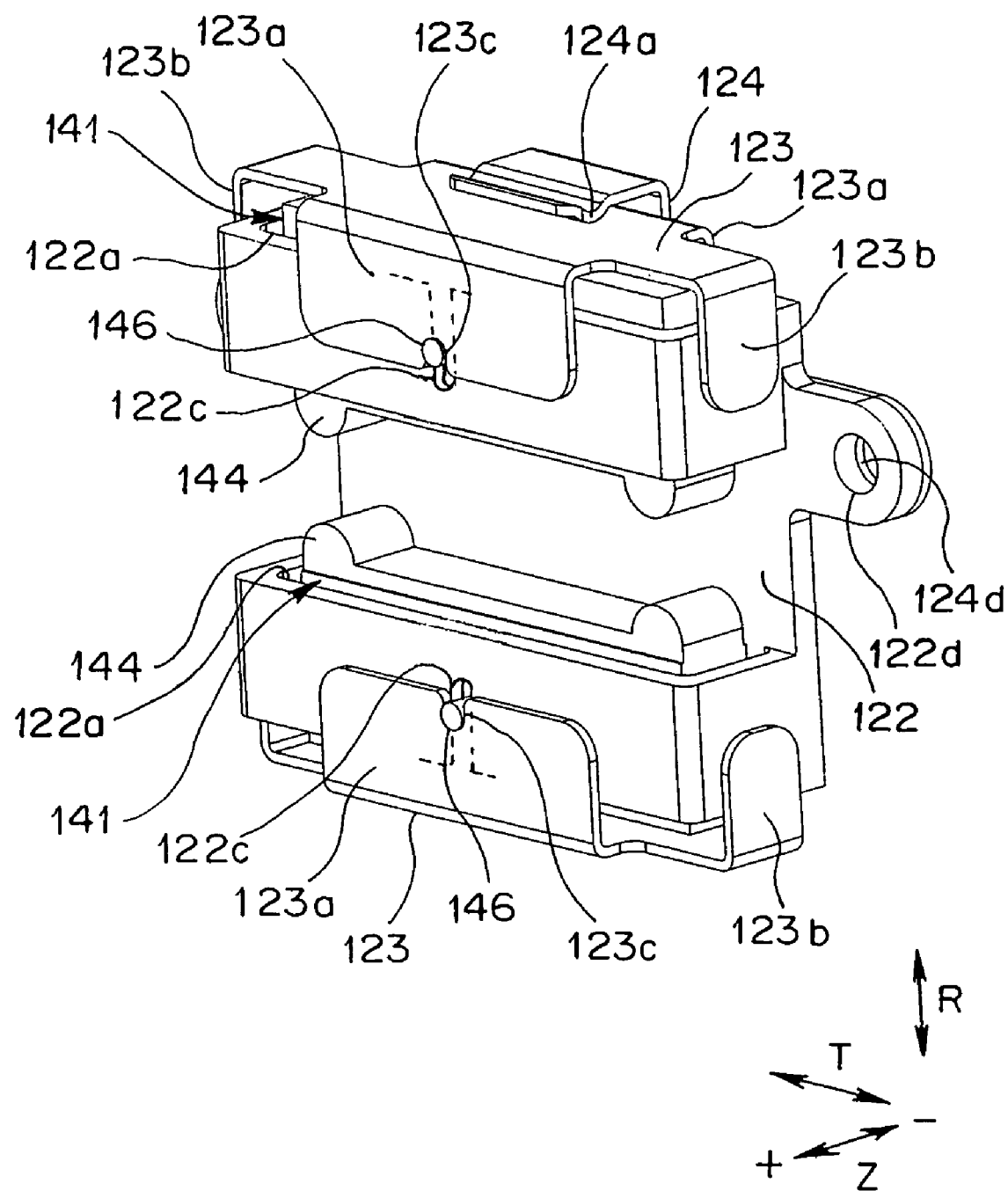
FIG. 20 is a perspective view showing appearances of a transducer and a transducer holder of the ultrasonic motor of FIG. 17.
Figure 21:
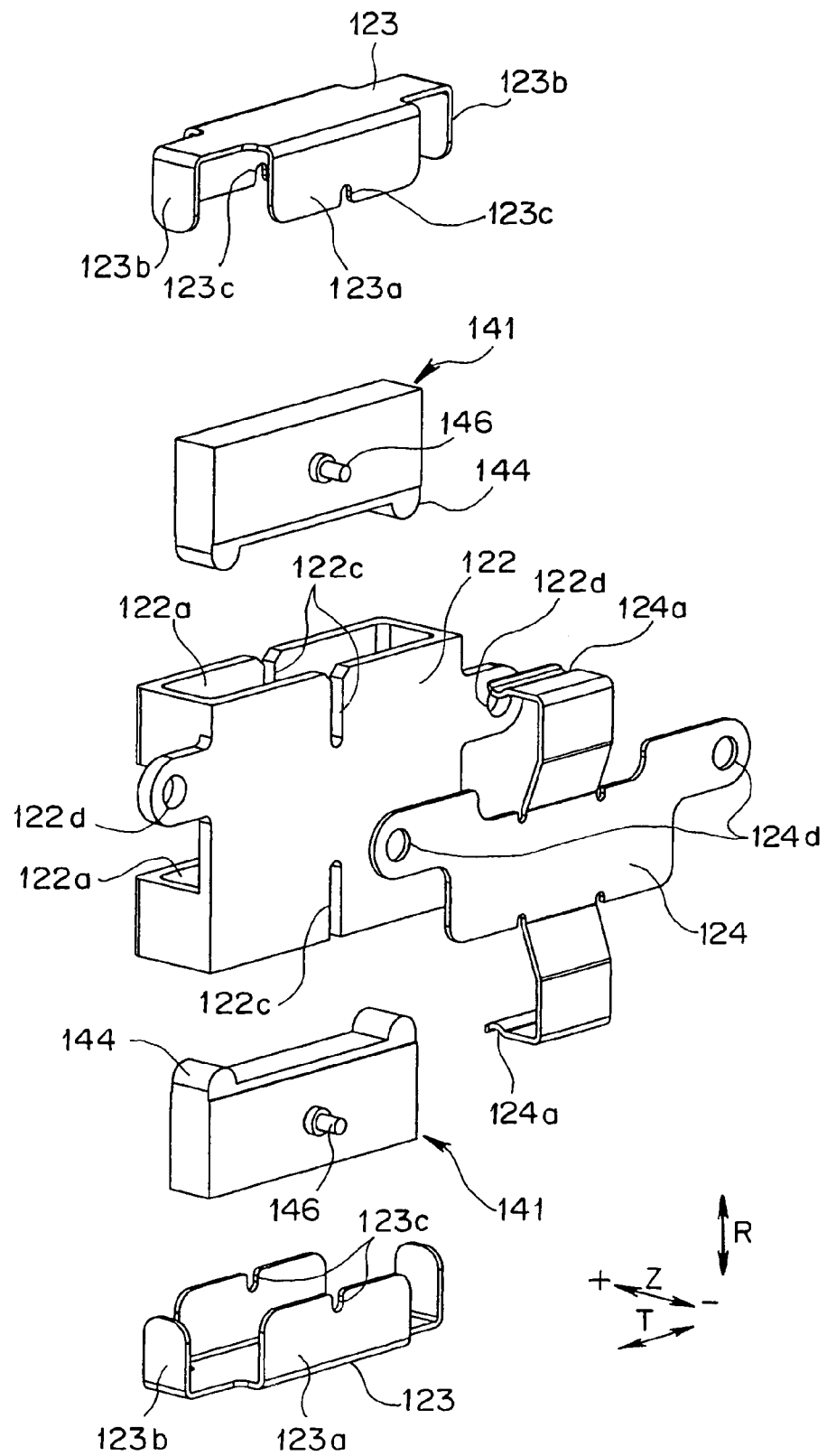
FIG. 21 is an exploded perspective view of the transducer and the transducer holder of the ultrasonic motor of FIG. 17.
Figure 22:
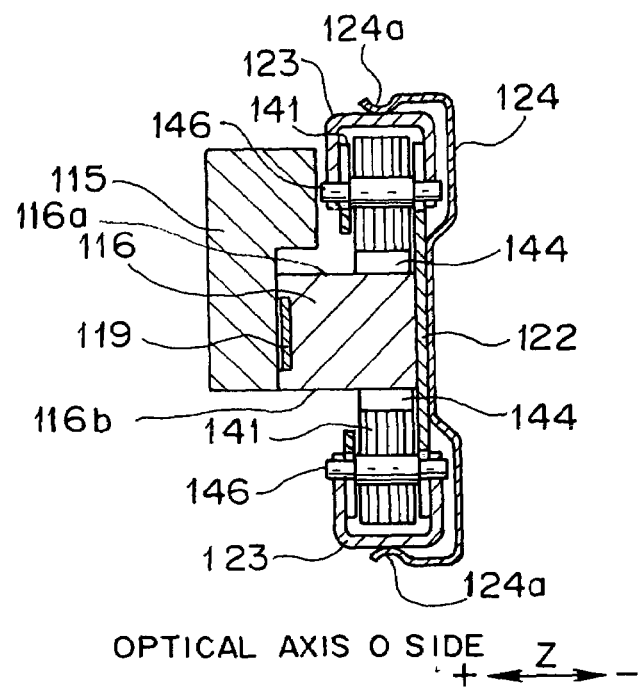
FIG. 22 is a sectional view at the line XXII-XXII of FIG. 18.
Figure 23:
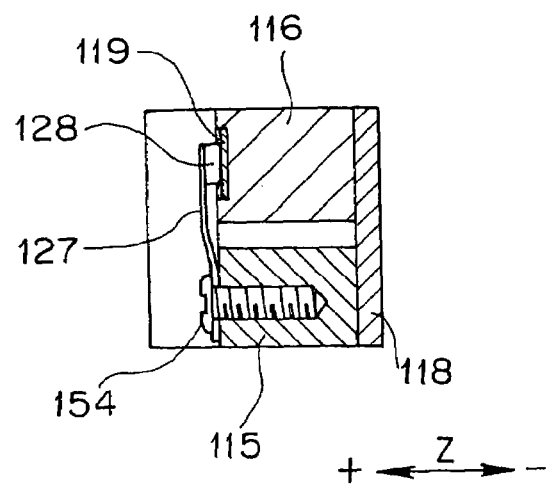
FIG. 23 is an enlarged sectional view of the ultrasonic motor of FIG. 17 in the vicinity of a magnetic sensor.

FIG. 16 is a longitudinal sectional view, coinciding with an optical axis, of a lens barrel having an ultrasonic motor according the second embodiment of the present invention mounted thereon; FIG. 17 is an exploded perspective view of the ultrasonic motor viewed from the focus side in the optical axial direction; FIG. 18 is a cross-sectional view at the line XVIII-XVIII of FIG. 16; FIG. 19 is an enlarged view of H portion of FIG. 18 showing a mounted state of a transducer of the ultrasonic motor; FIG. 20 is a perspective view of a transducer block in a state in which the transducer is held in a transducer holder; FIG. 21 is an exploded perspective view of the transducer block; FIG. 22 is a sectional view at the line XXII-XXII of FIG. 18 showing a mounted state of the transducer; and FIG. 23 is an enlarged sectional view of the ultrasonic motor in the vicinity of a magnetic sensor.

In the description below, the optical axis of a photographing lens composed of first to fourth lens groups is denoted as the optical axis O; the direction parallel with the optical axis O is denoted as the direction Z, in which symbol + denotes the object side, and symbol − denotes the focus side. The radial direction about the optical axis O is denoted as the direction R; and the tangential direction to a circumference of the optical axis O is denoted as the direction T. In addition, the optical axis O substantially agrees with the rotation shaft center of the stator and the rotor (below-mentioned).

A lens barrel 101 according to the second embodiment, as shown in FIG. 16, includes a fixed frame 102, a cam ring 103 supported on the external surface of the fixed frame 102, a zoom ring 104 fitted onto the circumference of the cam ring 103, a first group lens frame 105 holding a first lens group 135, a second group lens frame 106 located in the rear of the first group lens frame 105 for holding a second lens group 136, a third group lens frame 107 located in the rear of the second group lens frame 106 for holding a third lens group 137, a fourth group lens frame 108 located in the rear of the third group lens frame 107 for holding a fourth lens group 138 that is a focus lens, and an ultrasonic motor 140 as a drive source.

The fixed frame 102 is an annular frame member, and has at the annular part a circumferential guide groove 102*c*, a linear guide groove 102*a* arranged along the direction Z, a cam groove 102*b* slanting to the direction Z, and further has on the back end an end face 102*d* arranged in the rear for fixing the stator, and a notch 102*f* for inserting a focus drive arm. The fixed frame 102 is integrated on the rear end face with an end plate 131, a mount 133, by a screw 155. To the end plate 131, an external frame 132 is firmly fixed.

The cam ring 103 is an annular frame member, and is fitted onto the circumference of the fixed frame 102. An internal projection 103*c* is fitted into the circumferential guide groove 102*c* so as to be rotatably supported to the fixed frame 102 in a restricted state in the direction Z. The cam ring 103 is provided with two cam grooves 103*a* and 103*b* slanting to the direction Z.

The zoom ring 104 is an annular frame member, and is fitted onto the circumference of the cam ring 103 integrally in both the directions Z and T. On the circumference of the zoom ring 104, a grabbing rubber ring 104*a* is stuck.

The first group lens frame 105 is fixed and supported on the front end of the fixed frame 102.

The second and third group lens frames 106 and 107 are fitted into the fixed frame 102, and are provided with cam followers 111 and 112 fixed on their circumferences, respectively. The cam followers 111 and 112 are inserted into the linear guide groove 102*a* of the fixed frame 102 in a linearly guided state, and are slidably fitted into the cam grooves 103*a* and 103*b* of the cam ring 103, respectively. Thus, when the cam ring 103 is rotated by the zoom rotation of the zoom ring 104, the second and third group lens frames 106 and 107 are driven in the direction Z by the cam grooves 103*a* and 103*b* via the cam followers 111 and 112, respectively, so as to move to the respective zoom positions along the optical axial direction O.

The fourth group lens frame 108 is fitted into the fixed frame 102, and is provided with cam followers 113 fixed on its circumference. The cam followers 113 are slidably fitted into the cam groove 102*b* of the fixed frame 102. The fourth group lens frame 108 is provided with a guide groove 108*a* arranged along the direction Z. The focus drive arm 109 is fixed to a rotor 116 of the ultrasonic motor 140. The end of a focus drive arm 109 is slidably fitted into the guide groove 108*a*. Thus, when the rotor 116 of the ultrasonic motor 140 is rotated during focus driving, the fourth group lens frame 108 is rotated relatively to the fixed frame 102 via the focus drive arm 109, as will be described later. By the rotation, the cam followers 113 slide through the cam groove 102*b* so that the rotating fourth group lens frame 108 moves to the focus position in the direction Z (the optical axial direction O).

The ultrasonic motor 140 is an actuator for focus driving the fourth group lens frame 108 and, as shown in FIGS. 16 and 17, it includes a stator 115, the ring-shaped rotor 116, a press plate 118 for pressing the rotor, six bearing balls 121 as an object of rolling for a mechanism receiving the stator/rotor in the radial direction, a transducer block (FIGS. 20 and 21) including a transducer 141 (below-mentioned), a sensor support plate 127, and a magnetic sensor unit composed of a magnetic sensor 128.

The rotor 116, as shown in FIG. 17, is an annular member made of a hardwearing material, and it further includes an annular magnetic tape 119 protected with a polyester film on the side face in the −Z side and bonded to the rotor 116.

The stator 115, as shown in FIG. 17, is an annular member, and it includes a flange 115a on the inside circumferential side, a recess 115b arranged on the side face in the −Z side for attaching a transducer, notches 115c arranged on the inside circumferential part in the −Z side for inserting balls, and a recess 115f arranged in the +Z side for attaching the sensor support plate. The stator 115 is fixed by allowing the +Z end face of the flange 115a to abut the end face 102d of the fixed frame 102.

The ring-shaped rotor press plate 118 includes a notch 118a and screw insertion holes 118d. The rotor press plate 118 is fixed to the stator 115 by screwing screws 151 into screw insertion holes 115e formed on the −Z side face of the stator 115. The notch 118a serves as run off for the transducer block.

The balls 121 constituting the mechanism receiving the stator/rotor in the radial direction for relieving the rotational friction between the stator and the rotor, as shown in FIG. 18, are rollably fitted into the ball insertion notches 115c. The external surface of the ball very slightly protrudes inside the stator 115 so that the rotor 116 is rotated relatively to the stator 115 without clearance interposing the balls 121 therebetween when the circumference 116a of the rotor 116 is fitted into the stator 115. Also, the rotor 116 fitted into the stator 115 is restricted in the movement in the direction Z in a state clamped with the flange 115a on the inside circumferential side of the stator 115 and the rotor press plate 118. Instead of the balls 121, roller rolling objects may also be used.

The sensor support plate 127 for the magnetic sensor 128 serving as the magnetic sensor is fixed to the recess 115f of the stator 115 with screws 154. In this state, the magnetic sensor 128 is brought into sliding contact with the magnetic tape 119 of the rotor 116 so as to detect a rotation amount of the rotor 116. The sliding contact state is shown in the sectional view of FIG. 23.

The transducer block, as shown in FIGS. 17 and 18, is mounted in the recess 115b of the stator 115 for attaching a transducer for exciting an elliptical movement produced by combining the bending standing-wave vibration with the longitudinal vibration. The transducer block includes a pair of transducers 141 as a drive source, a transducer holder 122 for holding the transducers 141, a pair of transducer press members 123, an urging spring 124 for urging the transducers 141, and a flexible printed circuit board 148 for driving the transducer 141 (FIGS. 20 and 21).

The transducer 141, as shown in FIGS. 20 and 21, includes a multilayer piezoelectric transducer 142, drivers 144, and a support shaft 146 as a neutral shaft.

The support shaft 146 penetrates the multilayer piezoelectric transducer 142 in the laminating direction (the direction Z in the mounted state) through a node position (neutral position) of the vibration of the multilayer piezoelectric transducer 142 so as to be bonded. Both the ends of the shaft protrude from the multilayer piezoelectric transducer 142.

The driver 144 comprises a pair of projections which are located at both ends in the longitudinal direction on one end surface of the multilayer piezoelectric transducer 142 that is in a direction perpendicular to the support shaft 146.

In addition, the structure and effects of the transducer 141 will be described more in detail later with reference to FIGS. 24 to 30D.

Into the transducer holder 122, the two transducers 141 can be inserted so as to oppose each other. The transducer holder 122 includes two insertion holes 122a divided along the direction R to have an intermediate space therebetween and screw insertion holes 122d formed at both ends in the direction T. The insertion hole 122a is provided with notches 122c formed on both Z sides for rotatably inserting the support shaft 146 of the transducer thereinto along the direction R without clearance. The opening of the insertion hole 122a has a width in the direction Z capable of clamping the base step of the support shaft 146 in the axial direction without clearance.

The transducer press member 123 includes both-side folded portions 123a in the direction Z and both-side folded portions 123b in the direction T. The folded portion 123a is provided with a shaft-support notch 123c for fitting the support shaft 146 thereinto. The transducer press member 123 can be mounted on the transducer holder 122 by fitting the folded portions 123a and 123b onto the external circumference of the insertion hole 122a of the transducer holder 122.

The urging spring 124 made of a spring plate material includes elastically deformable convex press portions 124a and opposing each other in the direction R and screw insertion holes 124d formed on both ends in the direction T.

In the transducer block, the two transducers 141, as shown in FIGS. 20 and 21, are accommodated within the transducer holder 122 by inserting the respective transducers 141 into the insertion holes 122a of the transducer holder 122 from outside in the vertical direction R so as to fit the support shaft 146 into the notches 122c of the transducer holder 122 in a state in which the drivers 144 oppose each other. Then, the transducer press member 123 is placed to on the back (opposite to the driver) of the transducer 141 in the direction R so as to fit the transducer press member 123 onto the contour of the insertion hole 122a of the transducer holder 122. At this time, the support shaft 146 is fitted into the shaft-support notches 123c of the transducer press member 123. Furthermore, the press portions 124a of the urging spring 124 are abutted onto the transducer press members 123 from both outsides in the vertical direction (the state of FIG. 20).

The transducer block assembled as described above is mounted on the stator 115 by clamping the rotor 116 fitted into the stator 115 with the balls 121 therebetween in the radial direction. That is, the transducer block is inserted into the recess 115b of the stator 115 in a state in which the external circumferential surface 116a of the rotor 116 abuts the drivers 144 of one transducer 141 while the internal circumferential surface 116b of the rotor 116 abuts the drivers 144 of the other transducer 141. Screws 152 are inserted through the screw insertion holes 124d and 122d, and screwed into screw holes 115d of the stator 115, so that the transducer block is mounted on the stator 115.

In the mounted state mentioned above, the support shafts 146 of the pair of transducers 141 are supported along the direction Z on the notches of the transducer press members 123 and the transducer holder 122, which are fixed to the stator 115, while the two drivers 144 for each of the pair of transducers 141 are usually brought into pressure contact with the external circumferential surface 116a/the internal circumferential surface 116b of the rotor 116 so as to clamp the rotor 116 therebetween in the direction R (the radial direction). The pressure contact force is transmitted to the drivers 144 by the abutment between the shaft-support notch 123*c* (bottom) of the transducer press member 123 and the support shaft 146 of the transducer 141 due to the pressure of the urging spring 124.

As described above, by mounting the transducer block on the stator 115 and the rotor 116, the ultrasonic motor 140 is assembled in the lens barrel 101.

The structure and effects of the transducer 141 will be described herein with reference to FIGS. 24 to 30.

Figure 24:
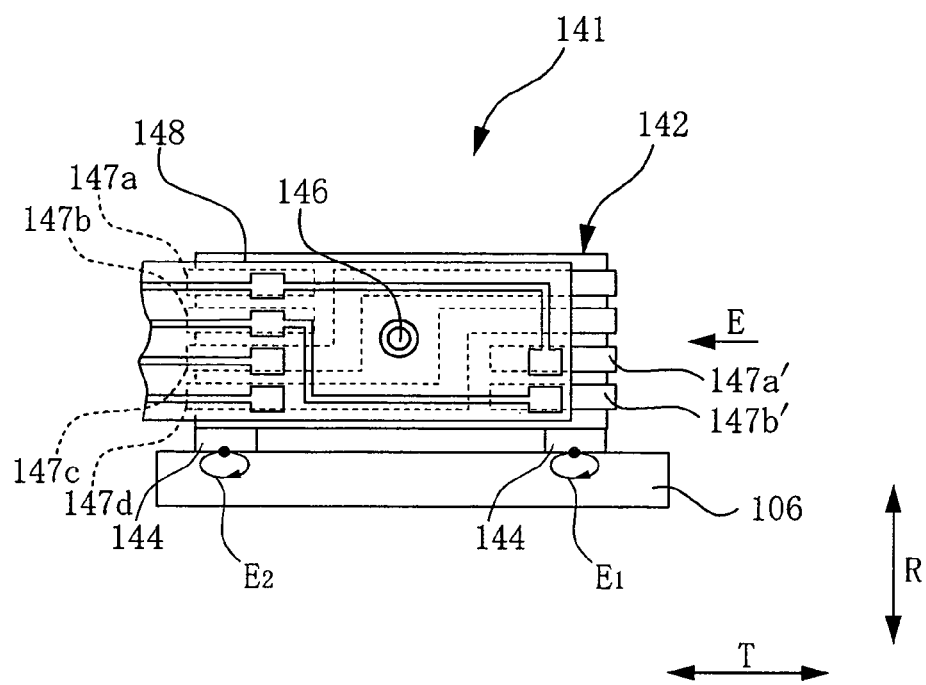
FIG. 24 is a drawing of the transducer having a flexible printed circuit board fixed thereto of the ultrasonic motor of FIG. 17 viewed from the support shaft.
Figure 25:
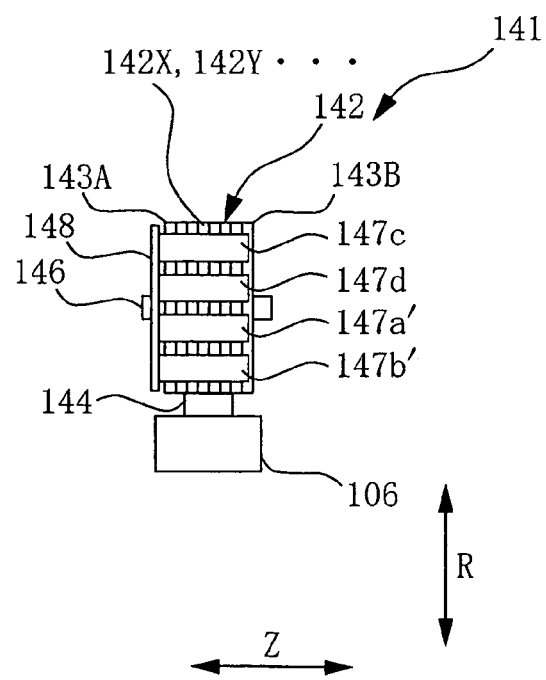
FIG. 25 is a drawing viewed in arrow E direction of FIG. 24.
Figure 26:
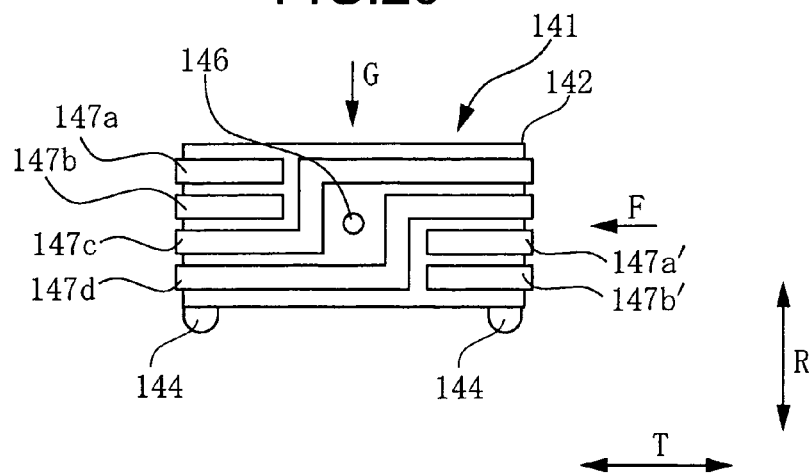
FIG. 26 is a drawing of a state in which the flexible printed circuit board is removed from the transducer of FIG. 24 and which is viewed from the support shaft.
Figure 27:
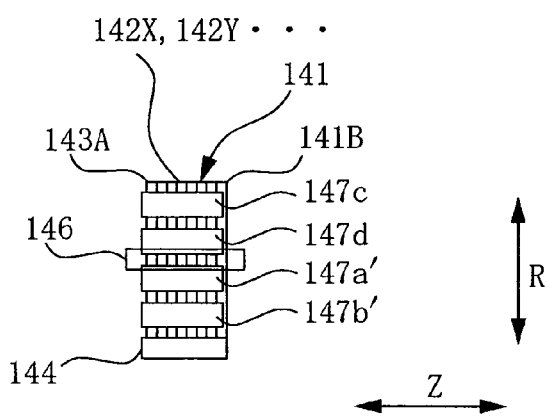
FIG. 27 is a drawing viewed in arrow F direction of FIG. 26.
Figure 28:
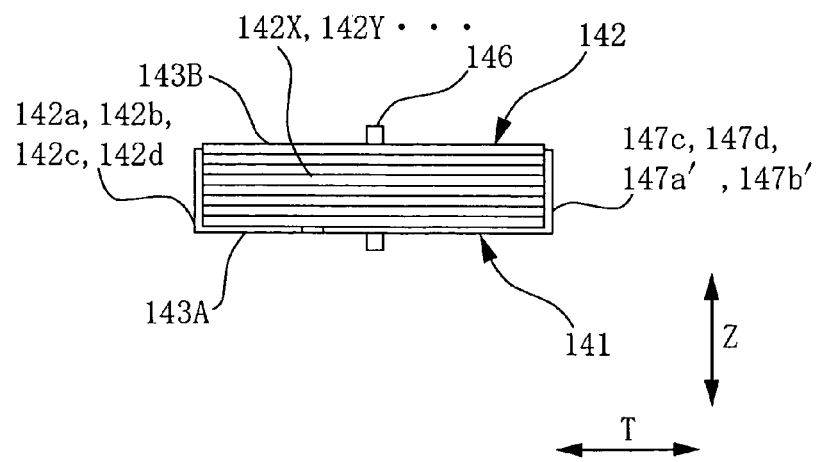
FIG. 28 is a drawing viewed in arrow G direction of FIG. 26.
Figure 29:
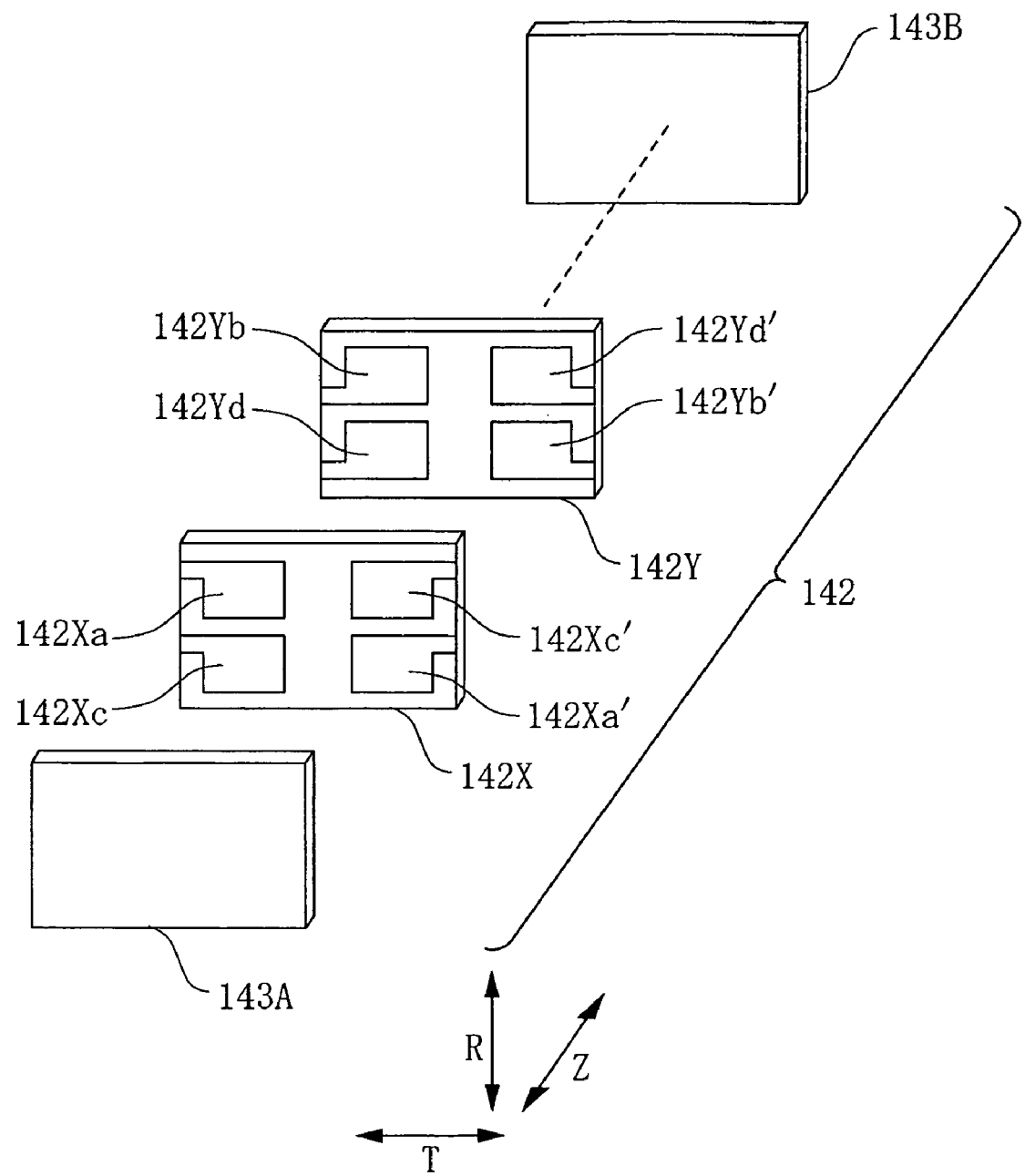
FIG. 29 is an exploded perspective view of a piezoelectric element and an insulation board constituting the transducer of FIG. 26 before a baking process.
Figure 30A:
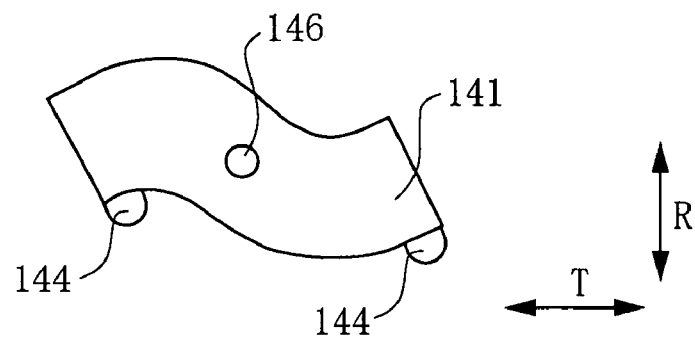
FIG. 30A shows a bending state in the composite vibration of the bending standing-wave vibration combined with the longitudinal vibration of the transducer of FIG. 26.
Figure 30B:
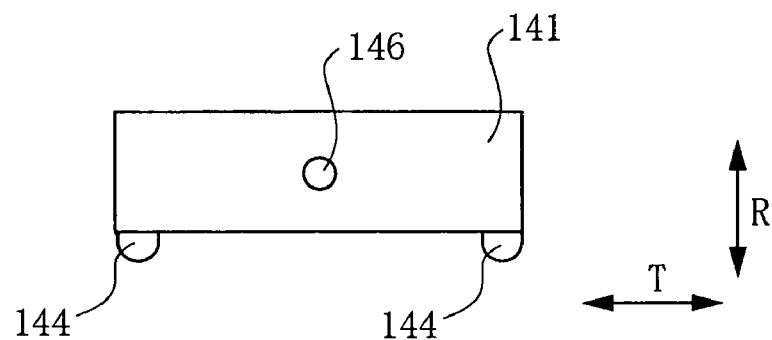
FIG. 30B shows an elongated state after the state of FIG. 30A in the composite vibration of the bending standing-wave vibration combined with the longitudinal vibration of the transducer of FIG. 26.
Figure 30C:
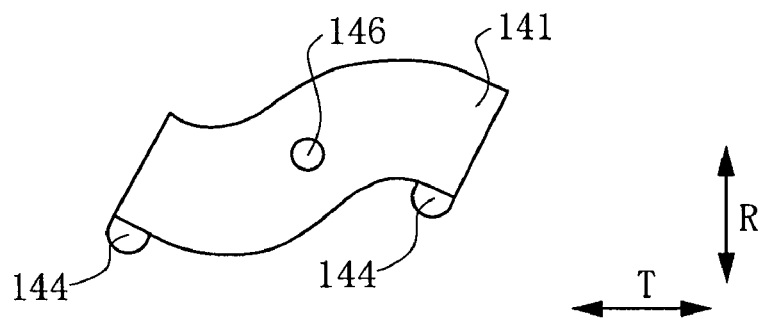
FIG. 30C shows a bending state after the state of FIG. 30B in the composite vibration of the bending standing-wave vibration combined with the longitudinal vibration of the transducer of FIG. 26.
Figure 30D:
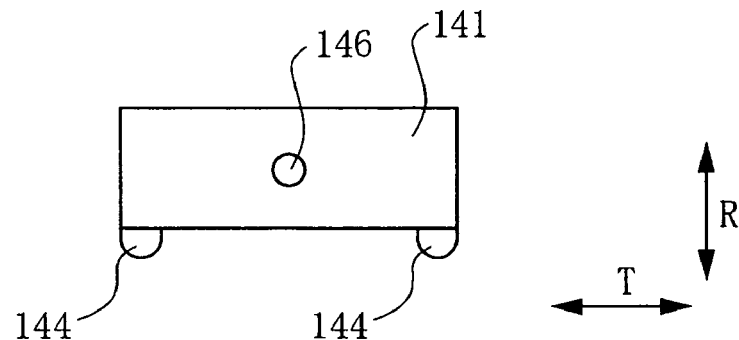
FIG. 30D shows a contraction state after the state of FIG. 30C in the composite vibration of the bending standing-wave vibration combined with the longitudinal vibration of the transducer of FIG. 26.

FIG. 24 is a drawing of the transducer 141 having a flexible printed circuit board fixed thereto viewed from the support shaft; FIG. 25 is a drawing viewed in arrow E direction of FIG. 24; FIG. 26 is a drawing of a state in which the flexible printed circuit board is removed from the transducer 141 in FIG. 24 viewed from the support shaft; FIG. 27 is a drawing viewed in arrow F direction of FIG. 26; FIG. 28 is a drawing viewed in arrow G direction of FIG. 26; FIG. 29 is an exploded perspective view of a piezoelectric element and an insulation board constituting the transducer before a baking process; and FIGS. 30A to 30D are enlarged drawings of the composite vibration of the bending standing-wave vibration combined with the longitudinal vibration of the transducer sequentially showing deformation states from a bending state of FIG. 30A, an elongated state of FIG. 30B, a bending state of FIG. 30C, to a contraction state of FIG. 30D.

The transducer 141 constituting the ultrasonic motor 140, as shown in FIGS. 26 and 29, includes a plurality of piezoelectric sheets of two kinds 142X and 142Y, the multilayer piezoelectric transducer 142 composed of two insulation plates 143A and 143B, electrodes 147*a*, 147*b*, 147*c*, 147*d*, 147*a*', and 147*b*' made of conductive silver paste, the one support shaft 146, and a pair of the drivers 144.

The respective two-kind piezoelectric sheets 142X and 142Y are composed of a rectangular piezoelectric element with a thickness of about 100 μm. The piezoelectric sheet 142X is provided with first internal electrodes 142X*a*, 142X*c*, 142X*c*', and 142X*a*' coated with a silver/palladium alloy with a thickness of about 10 μm so as to be divided into four insulated regions applied on the front surface. The upper end of each internal electrode extends to the end face of the piezoelectric element in the longitudinal direction (direction T) (FIG. 29).

On the other hand, the piezoelectric sheet 142Y is provided with second internal electrodes 142Y*b*, 142Y*d*, 142Y*d*', and 142Y*b*' coated with a silver/palladium alloy with a thickness of about 10 μm so as to be divided into four insulated regions applied on the front surface. The lower end of each internal electrode extends to the end face of the piezoelectric element in the longitudinal direction (direction T) (FIG. 29).

The first internal electrodes 142X*a*, 142X*c*, 142X*c*', and 142X*a*' and the second internal electrodes 142Y*b*, 142Y*d*, 142Y*d*', and 142Y*b*' of the respective piezoelectric sheets 142X and 142Y adjacent to each other are the same in shape while being upside down in electrode-end shape so that the rectangular electrode surfaces are overlapped with each other when the piezoelectric sheets are deposited. The two-kind piezoelectric sheets 142X and 142Y having such internal electrodes are alternately deposited so as to have about 40 layers in total.

As shown in FIG. 29, the deposited piezoelectric element is provided with an internal electrode exposed portion (not shown) formed on the left end face so as to expose ends of the first internal electrodes 142X*a* and 142X*c* and the second internal electrodes 142Y*b* and 142Y*d* in a deposited state.

The deposited piezoelectric element is also provided with an internal electrode exposed portion (not shown) formed on the right end face so as to expose ends of the first internal electrodes 142X*c*' and 142X*a*' and the second internal electrodes 142Y*d*' and 142Y*b*' in a deposited state. Furthermore, on both side faces of the internal electrode exposed portions, external electrodes made of silver paste, four in total, are independently formed so as to be conductive to the internal electrodes (FIG. 27).

On the front and rear surfaces of the deposited piezoelectric element, insulation plates 143A and 143B with the same rectangular shape as that of the piezoelectric sheets 142X and 142Y are arranged, respectively, so as to constitute the rectangular parallelepiped multilayer piezoelectric transducer 142. On the surface of the front insulation plate 143A, electrodes 147*a*, 147*b*, 147*c*, 147*d*, 147*a*', and 147*b*' made of conductive silver paste are formed as shown in FIG. 26.

The electrodes 147*a*, 147*b*, 147*c*, 147*d*, 147*a*', and 147*b*' on the insulation plate 143A are electrically connected to the deposited both-side internal electrodes exposed to both sides for every layered piezoelectric sheet, respectively. That is, to the electrode 147*a*, the first internal electrode 142X*a* is electrically connected; to the electrode 147*b*, the second internal electrode 142Y*b* is electrically connected; to the electrode 147*c*, the first internal electrode 142X*c* and the first internal electrode 142X*c*' are electrically connected; to the electrode 147*d*, the second internal electrode 142Y*d* and the second internal electrode 142Y*d*' are electrically connected; to the electrode 147*a*', the first internal electrode 142X*a*' is electrically connected; and to the electrode 147*b*', the second internal electrode 142Y*b*' is electrically connected.

When the multilayer piezoelectric transducer 142 having the insulation plates 143A and 143B overlapped thereon is baked on the deposited piezoelectric sheets 142X and 142Y in the electrode-connection state so as to polarize the multilayer piezoelectric transducer 142 using the above-mentioned electrodes, it becomes the transducer 141.

At end positions in the direction T on the end face of the transducer 141 in the direction R (the direction perpendicular to the depositing direction), a pair of the drivers 144 are bonded, respectively. In addition, the driver 144 is formed by dispersing alumina in a high polymeric material.

Furthermore, at the substantial center of the transducer 141, which is the vibration neutral point (node position) of the transducer, a through-hole is formed in the depositing direction (the direction Z). The support shaft 146 made of stainless steel as a neutral shaft is penetrated through the through-hole in the direction Z so as to be bonded (FIG. 27).

On the electrodes 147*a*, 147*b*, 147*c*, 147*d*, 147*a*', and 147*b*' provided on the insulation plate 143A of the transducer 141, a flexible printed circuit board 148 having a connection pattern is mounted in an electrically connected state to the respective electrodes. To the flexible printed circuit board 148, a printed circuit board 149 having a transducer drive circuit is connected.

The transducer drive circuit includes an oscillation circuit, a phase-shift circuit, and a drive circuit, and it applies the phase-controlled drive voltage to the transducer 141 via the drive circuit.

The transducer 141 is driven through the flexible printed circuit board 148 by the drive voltage so as to generate the composite vibration of the bending standing-wave vibration combined with the longitudinal vibration shown in FIGS. 30A to 30D. Thereby, out of phase elliptical vibrations (trajectories E1 and E2 shown in FIG. 24) are generated at ends of the drivers 144. Since at the ends of the drivers 144, the external and internal circumferential surfaces of the rotor 116, which is a driven object, are urged, the rotor 116 is relatively rotated via the drivers 144 in the rotational direction of the elliptical vibration.

In the lens barrel 101 according to the embodiment constructed as described above, upon zoom driving, the cam ring 103 is rotated by rotating the zoom ring 104 so as to advance the second and third group lens frames 106 and 107 back and forth in the optical axial direction O via the cam followers 111 and 112. On the other hand, upon focus driving, when the pair of transducers 141 are driven by the transducer drive circuit so that the drivers 144 are vibrated along elliptical trajectories, the rotor 116 having the drivers 144 abutted thereto is rotated relatively to the stator 115 in any direction. By the rotation of the rotor 116, the fourth group lens frame 108 is rotated via the focus drive arm 109 so as to move in the optical axial direction O along the cam groove 102b of the fixed frame 102 for focusing.

According to the lens barrel 101 having the above-described ultrasonic motor 140 according to the embodiment assembled thereto, the drivers 144 of the pair of transducers 141 abut the external and internal circumferential surfaces so as to oppose thereto, while the transducer 141 is supported by the transducer holder 122 slightly movably to the rotor 116 in the radial direction, and is pressurize by an urging force of the urging spring 124 for holding. Hence, the abutment force of the driver 144 does not deviate from the rotor 116, so that the rotor is stably supported in the radial direction, suppressing the frictional loss during the rotation.

Because the transducer block is arranged together in one place on the stator 115, the arrangement of the transducer block is facilitated while the arrangement of the flexible printed circuit board is not complicated, enabling the lens barrel to be miniaturized.

In the ring-shaped ultrasonic motor 140, by pressurizing at least two transducers in the radial direction of the rotor, advantages that motor efficiencies are improved and the arrangement limits are small are obtained.

Also, the ultrasonic motor 140 may be incorporated to a rotational instrument other than the lens barrel requiring a large space in the center of the rotor.

Next, a modification with regard to a stator/rotor fitting mechanism of the ultrasonic motor 140 according to the second embodiment will be described with reference to the enlarged sectional view of the stator/rotor fitting mechanism of FIG. 31 and the enlarged sectional view of the transducer mounting part of FIG. 32.

In this modification, only a ball support structure provided in the stator/rotor fitting mechanism is different from that of the second embodiment described above. In this description, the same reference characters designate the same components in the second embodiment.

Figure 31:
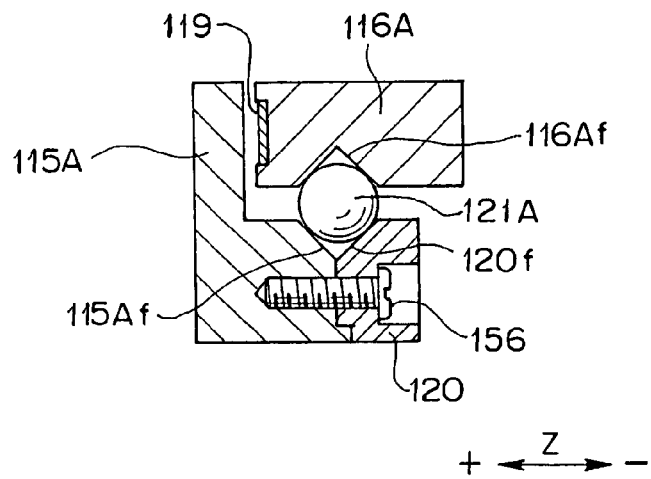
FIG. 31 is an enlarged sectional view of a stator/rotor fitting mechanism according to a modification with regard to a stator/rotor fitting mechanism of the ultrasonic motor of FIG. 17.

According to the modification, as shown in FIG. 31, to the rear surface (−Z side) of a stator 115A, a ring-shaped press plate 120 can be fixed, and the stator 115A and the press plate 120 are provided with cut-surfaces 115Af and 120f, respectively, formed along the circumferential direction of the junction between the stator 115A and the press plate 120. Also, a rotor 116A is provided with a V-groove 116Af formed to oppose the above-mentioned junction along its circumferential direction. Upon assembling, the rotor 116A having rolling bearing balls 121A inserted into the V-groove 116Af is inserted into the circumference of the stator 115A. Then, when the press plate 120 is fixed on the rear surface of the stator 115A with screws 156, the balls 121A are supported with the V-groove 116Af and the cut-surfaces 115Af and 120f, so that the rotor 116A is restricted in the direction Z relative to the stator 115A while being rotatably supported without clearance. In addition, a plurality of the balls 121A are arranged in the circumferential direction and are held by retainers (not shown).

Figure 32:
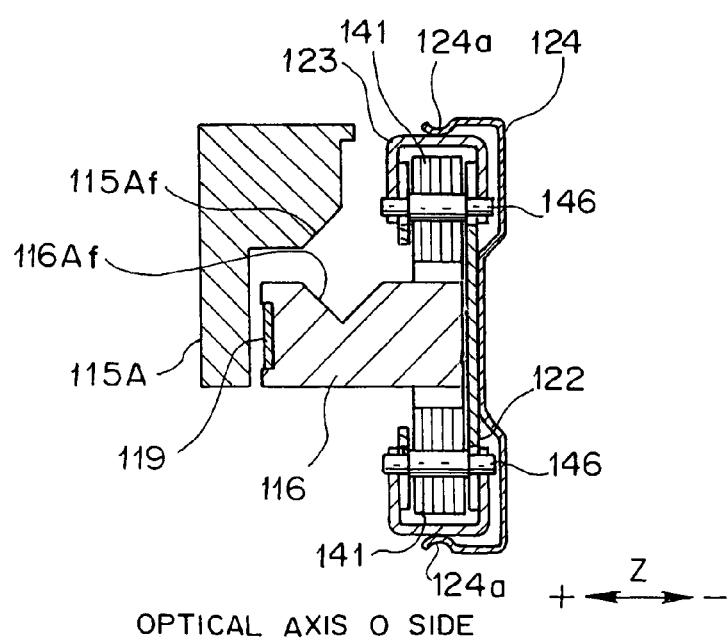
FIG. 32 is an enlarged sectional view of a transducer block mounting part in the ultrasonic motor incorporating the stator/rotor fitting mechanism according to the modification of FIG. 31.

The transducer block has the same structure as that applied to the second embodiment, and as shown in FIG. 32, the transducer block is assembled to the stator 115A and the rotor 116A in the same way as in the embodiment.

According to the stator/rotor fitting state mentioned above, the rotor 116A is rotatably supported by the stator 115A with the balls 121A therebetween while being restricted in position in the direction Z relative to the stator 115A. Thus, the rotor press plate 118 is not required, which is applied to the second embodiment for restricting the movement in the direction Z, so that as shown in FIG. 31, a clearance is provided between the rotor 116A and the stator 115A so as to open the −Z side of the rotor 116A (opposite side to the stator).

According to the modification, an ultrasonic motor can be provided that has an improved conversion efficiency and is capable of driving the rotor with high accuracy, because the rotor 116A can be rotated relative to the stator 115A with a small rotational load due to the thrust positioning with the rolling balls 121A. Also, the rotor press plate provided on the side of the rotor 116A for restriction in position in the direction Z can be eliminated.

Next, an ultrasonic motor according to a third embodiment of the present invention will be described with reference to FIGS. 33 and 34.

Figure 33:
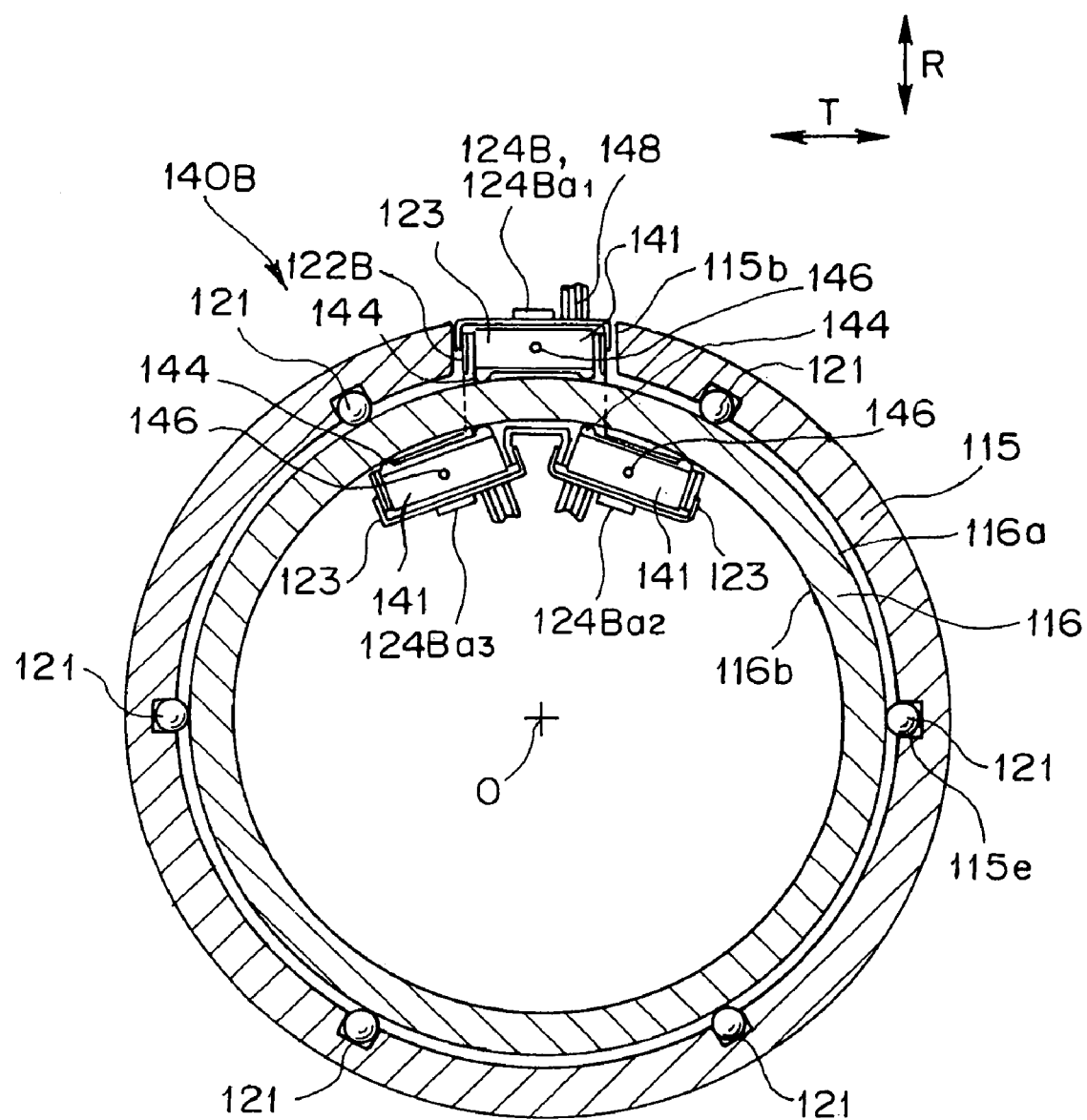
FIG. 33 is a cross-sectional view of a third embodiment of the present invention showing a mounted state of a transducer.

FIG. 33 is a cross-sectional view of the third embodiment showing a transducer mounted on the ultrasonic motor corresponding to FIG. 18; FIG. 34 is a perspective view of a transducer block according to the embodiment.

In an ultrasonic motor 140B according to the embodiment, the number of transducers is different from that of the transducers incorporated in the ultrasonic motor 140, which is applied to the lens barrel 101 according to the second embodiment. That is, three transducers are arranged to abut the external and internal circumferences of the rotor 116, respectively. For example, this may be applied for the purpose of torque reinforcement to two transducers. The structures other than the transducer block including the transducer are substantially the same as those of the second embodiment. In this description, the same reference characters designate the same components in the second embodiment.

Figure 34:
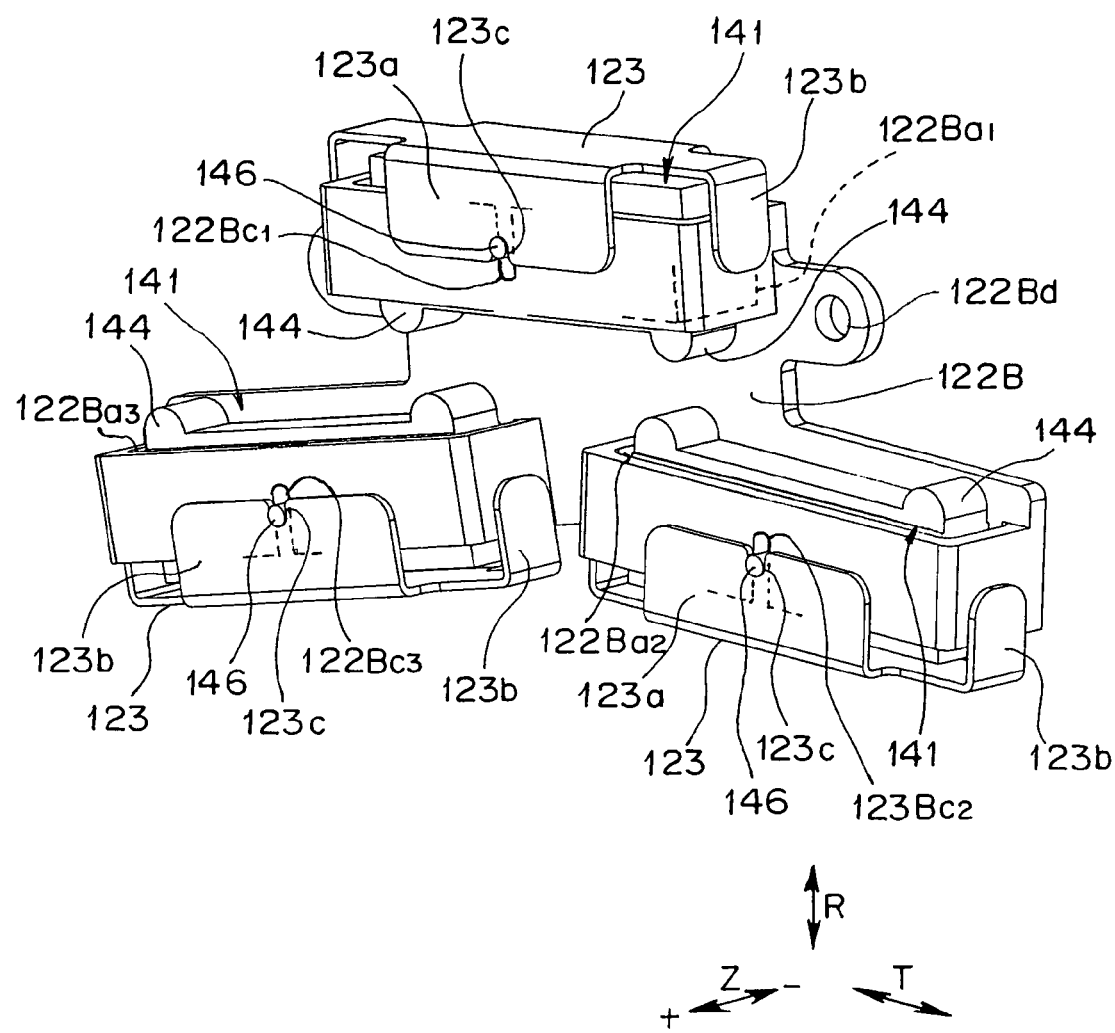
FIG. 34 is a perspective view of a transducer block in the ultrasonic motor of FIG. 33.

The transducer block of the ultrasonic motor 140B according to the embodiment, as shown in FIGS. 33 and 34, is mounted in the recess 115b of the stator 115 for attaching a transducer for exciting an elliptical movement produced by combining the bending standing-wave vibration with the longitudinal vibration in the same way as in the transducer applied to the second embodiment. The transducer block includes three transducers 141 as a drive source, a transducer holder 122B for holding the three transducers 141, three transducer press members 123, an urging spring 124B for urging the transducers 141 as three urging means, and the printed circuit board 149 for driving the transducers.

The transducer holder 122B includes three insertion holes to be inserted by each transducer 141, which are a hole 122Ba1 formed in the upper in the direction R and holes 122Ba2 and 122Ba3 formed in the lower in the direction R, and screw-insertion holes 122Bd formed at both ends in the direction T. Between the upper hole 122Ba1 and the lower holes 122Ba2 and 122Ba3, a space is provided for inserting the rotor 116 thereinto along its circumferential direction.

The insertion holes 122Ba1, 122Ba2, and 122Ba3 are provided with notches 122Bc1, 122Bc2, and 122Bc3 formed on both Z sides for rotatably inserting the support shaft 146 of the transducer thereinto along the direction R without clearance. The opening of the respective insertion holes 122Ba1, 122Ba2, and 122Ba3 has a width in the direction Z capable of clamping the base step of the support shaft 146 without clearance.

The urging spring 124B made of a spring plate material includes three elastically deformable convex press portions 124Ba1, 124Ba2, and 124Ba3 arranged at external and internal ends in the direction R so as to correspond to insertion holes 122Bc1, 122Bc2, and 122Bc3, respectively, and a screw insertion hole formed at an end in the direction T. In addition, the urging spring 124B is not shown in FIG. 34.

In the transducer block, the three transducers 141, as shown in FIG. 34, are accommodated within the transducer holder 122B by inserting the respective transducers 141 into the insertion holes 122Ba1, 122Ba2, and 122Ba3 of the transducer holder 122B from the outside in the direction R so as to fit the respective support shafts 146 into the notches 122Bc1, 122Bc2, and 122Bc3 of the transducer holder 122B in a state in which the drivers 144 oppose each other. Then, the three transducer press members 123 are placed to cover the backsides (opposite to the driver) of the transducers 141 in the direction R so as to fit the transducer press members 123 onto the contours of the insertion holes 122Ba1, 122Ba2, and 122Ba3 of the transducer holder 122B, respectively. At this time, the support shaft 146 is fitted into the shaft-support notches 123c of the transducer press member 123. Furthermore, the press portions 124Ba1, 124Ba2, and 124Ba3 of the urging spring 124 are abutted on the outsides of the three transducer press members 123, respectively.

The transducer block assembled as described above is mounted between the stator 115 fixed to the lens barrel and the rotor 116 fitted into the stator 115 with the balls 121 therebetween in the radial direction. That is, the transducer block is inserted into the recess 115b of the stator 115 in a state in which the external circumferential surface 116a of the rotor 116 abuts the drivers 144 of one transducer 141 on the outer diameter side while the internal circumferential surface 116b of the rotor 116 abuts the drivers 144 of the two other transducers 141 on the inner diameter side. Screws are inserted through the screw insertion holes of the transducer holder 122B and the urging spring 124B, and are screwed into screw holes 115d of the stator 115, so that the transducer block is mounted on the stator 115.

In the mounted state mentioned above, the support shafts 146 of the three transducers 141 are supported along the direction Z on the notches of the transducer press members 123 and the transducer holder 122B, which are fixed and supported to the stator 115. The drivers 144 of one transducer 141 on the outer diameter side are usually brought into pressure contact with the external circumferential surface 116a while the drivers 144 of the two other transducers 141 on the inner diameter side are usually brought into pressure contact with the internal circumferential surface 116b of the rotor 116 so as to clamp the rotor 116 therebetween in the direction R (the radial direction). The pressure contact force is transmitted to the drivers 144 by the abutment between the shaft-support notch 123c (bottom) of the transducer press member 123 and the support shaft 146 of the transducer 141 due to the pressure of the urging spring 124B.

As described above, by mounting the transducer block on the stator 115 and the rotor 116, the ultrasonic motor 140B is assembled in the lens barrel 101.

In the lens barrel having the ultrasonic motor 140B constructed as described above, upon focus driving, when the three transducers 141 are driven by the transducer drive circuit so that the drivers 144 are vibrated along elliptical trajectories, the rotor 116 abutted by the drivers 144 is rotated relative to the stator 115 in any direction. When the rotor 116 is driven, it is necessary that drive voltages with different waveforms are supplied to one transducer 141 on the outer diameter side among the three transducers 141 and the other two transducers 141 on the inner diameter side, respectively, so that the one transducer 141 and the other two transducers 141 are vibrated along directions opposite to each other of the trajectories of the elliptical vibrations on the respective drivers 144 of the two transducers 141, respectively.

According to the ultrasonic motor 140B of the embodiment described above, the same advantages as those of the ultrasonic motor 140 according to the second embodiment can be obtained; in particular, because three transducers are incorporated according to the embodiment, the motor is preferable for an apparatus requiring a large drive torque such as a lens barrel. Alternatively, it is possible to provide a drive unit with three smaller-sized transducers having the same torque as that of a drive unit using two transducers. A plurality of transducers for the outer diameter side and one or two transducers for the inner diameter side may be incorporated.

Drive sources according to the embodiments described above are ultrasonic motors; however, the spirit and scope of the present invention may incorporate oscillatory waves other that ultrasonic waves, so that it can be applied to a so-called oscillatory wave motor so as to have the same effects.

The present invention is not limited to the embodiments described above, so that various modifications may be made during execution phase within the spirit and scope of the invention. Furthermore, the above-described embodiments include inventions at various stages so that various inventions can be extracted from appropriate combinations of a plurality of disclosed constituent features.

For example, even if several constituent features are omitted from the entire constituent features of the embodiments, when the problems described above can be solved and the effects described above can be obtained, the constituent features other than the omitted features may be extracted as an invention.

What is claimed is:

1. An ultrasonic motor comprising:
    at least one transducer exciting an elliptical movement produced by combining a bending standing-wave vibration with a longitudinal vibration;
    a support member for holding the transducer;
    a first body of rotation arranged rotatably about an axis in relation to the support member so as to be able to come in contact with one of both ends of the transducer in the axial direction;
    a second body of rotation supported to the first body of rotation so as to rotate integrally with the first body of rotation and arranged rotatably about the axis as well as relatively to the support member so as to be able to come in contact with the other of both ends of the transducer in the axial direction; and urging means for urging the first and second bodies of rotation in the axial direction so as to usually abut the transducer.

2. The ultrasonic motor according to claim 1, wherein the transducer is attached to the support member so that the position of the transducer in circumferential and radial directions is restricted.

3. The ultrasonic motor according to claim 1, wherein the transducer is supported on the support member rotatably about the axis in a direction substantially perpendicular to the rotational axis of the first and second bodies of rotation.

4. The ultrasonic motor according to claim 1, wherein a plurality of the transducers are arranged so as to have substantially the same interval in the circumferential direction of the first and second bodies of rotation.

5. The ultrasonic motor according to claim 4, wherein three transducers are arranged so as to have intervals of about 120° in the circumferential direction of the first and second bodies of rotation.

6. The ultrasonic motor according to claim 1, wherein the urging means is provided so as to usually rotate integrally with the first and second bodies of rotation.

7. The ultrasonic motor according to claim 1, wherein the transducer has a predetermined length in the axial direction and at least one transducer is arranged in the circumferential direction of the bodies of rotation, further comprising at least one spacer member, having substantially the same predetermined length as that of the transducer, arranged on the support member so as to usually come in contact with the first and second bodies of rotation by clamping, and wherein the transducer and the spacer member are arranged so as to have substantially the same interval in the circumferential direction of the first and second bodies of rotation.

8. The ultrasonic motor according to claim 7, wherein the spacer member is a ball or roller rolling element and a plurality of the elements are overlapped along the axial direction of the first and second bodies of rotation.

9. The ultrasonic motor according to claim 1, wherein the transducer is fixed to the support member only at a node, which is a neutral point of the vibration produced by combining the bending standing-wave vibration with the longitudinal vibration.

10. An ultrasonic motor comprising:

at least one transducer exciting an elliptical movement produced by combining a bending standing-wave vibration with a longitudinal vibration;

a support member for holding the transducer;

a first body of rotation arranged rotatably about an axis in relation to the support member so as to be able to come in contact with one of both ends of the transducer in the axial direction;

a second body of rotation supported to the first body of rotation movably in the axial direction so as to rotate about the axis usually integrally with the first body of rotation as well as relatively to the support member so as to be able to come in contact with the other of both ends of the transducer in the axial direction; and urging means supported to rotate usually integrally with the first and second bodies of rotation for urging the second body of rotation in the axial direction so that the first and second bodies of rotation usually abut the transducer.

11. An ultrasonic motor comprising:

at least two transducers exciting an ultrasonic elliptical vibration;

an annular rotor rotated relatively to the transducers by the effect of the elliptical vibration due to the transducers arranged at predetermined positions along a circumference;

a stator for rotatably supporting the rotor, and supporting the two transducers so as to restrict their positions in a rotation axial direction and a circumferential direction, as well as supporting the two transducers movably in the radial direction of the rotor so that the two transducers oppose external and internal walls of the rotor in the radial direction perpendicular to the rotation axis of the rotor to be able to come in contact with the external and internal walls;

urging means for urging the two transducers in the radial direction of the rotor so that the two transducers usually come in pressure contact with the external and internal walls of the rotor in the radial direction perpendicular to the rotation axis of the rotor; and further comprising a rotor press member attached to the stator for rotatably clamping the rotor to the stator in the rotation axial direction.

12. An ultrasonic motor comprising:

at least two transducers exciting an ultrasonic elliptical vibration;

an annular rotor rotated relatively to the transducers by the effect of the elliptical vibration due to the transducers arranged at predetermined positions along a circumference;

a stator for rotatably supporting the rotor, and supporting the two transducers so as to restrict their positions in a rotation axial direction and a circumferential direction, as well as supporting the two transducers movably in the radial direction of the rotor so that the two transducers oppose external and internal walls of the rotor in the radial direction perpendicular to the rotation axis of the rotor to be able to come in contact with the external and internal walls;

urging means for urging the two transducers in the radial direction of the rotor so that the two transducers usually come in pressure contact with the external and internal walls of the rotor in the radial direction perpendicular to the rotation axis of the rotor; and further comprising a plurality of rolling elements arranged along a circumference between the rotor and the stator in the radial direction so that the plurality of rolling elements come in contact with both the rotor and stator.

13. The ultrasonic motor according to claim 12, wherein contact portions of the stator and the rotor with the plurality of rolling elements are formed so as to restrict the position of the rotor in the rotation axial direction at a predetermined position.

14. An ultrasonic motor comprising:

a pair of transducers exciting an ultrasonic elliptical vibration produced by combining a bending standing-wave vibration with a longitudinal vibration;

an annular rotor rotated relatively to the transducers by the effect of the elliptical vibration due to the transducers arranged at predetermined positions along a circumference;

a stator for rotatably supporting the rotor;

a transducer holder fixed to the stator for holding the pair of transducers movably in the radial direction of the rotor by restricting the position of the rotor in the rotation axial direction and the circumferential direction at a neutral axial portion of the combined vibration;

a transducer press member for supporting the pair of transducers at the neutral axial portion of the combined vibration relative to the transducer holder; and urging means for urging the pair of transducers with the transducer press member therebetween in the radial direction of the rotor so that the pair of transducers come close to each other, wherein the pair of transducers are structured to usually come in pressure contact with external and internal walls of the rotor in the radial direction perpendicular to the rotation axis of the rotor by clamping.

15. The ultrasonic motor according to claim 14, further comprising a rotor press member attached to the stator for rotatably clamping the rotor to the stator in the rotation axial direction.

16. The ultrasonic motor according to claim 14, further comprising a plurality of rolling elements arranged along a circumference between the rotor and the stator in the radial direction so that the plurality of rolling elements come in contact with both the rotor and stator.

17. The ultrasonic motor according to claim 16, wherein contact portions of the stator and the rotor with the plurality of rolling elements are formed so as to restrict the position of the rotor in the rotation axial direction at a predetermined position.

18. An ultrasonic motor comprising:

a plurality of transducers exciting an ultrasonic elliptical vibration produced by combining a bending standing-wave vibration with a longitudinal vibration;

an annular rotor rotated relatively to the transducers by the effect of the elliptical vibration due to the transducers arranged at predetermined positions along a circumference;

a stator for rotatably supporting the rotor;

a transducer holder fixed to the stator for holding the plurality of transducers movably in the radial direction of the rotor by restricting the position of the rotor in the rotation axial direction and the circumferential direction at a neutral axial portion of the combined vibration;

a transducer press member for supporting the plurality of transducers at a neutral axial portion of the combined vibration relative to the transducer holder; and urging means for urging the plurality of transducers with the transducer press member therebetween in the radial direction of the rotor so that the plurality of transducers come close to each other, wherein the plurality of transducers are structured to usually come in pressure contact with external and internal walls of the rotor in the radial direction perpendicular to the rotation axis of the rotor by clamping.

* * * * *

UNITED STATES PATENT AND TRADEMARK OFFICE
CERTIFICATE OF CORRECTION

PATENT NO. : 7,242,131 B2
APPLICATION NO. : 11/119565
DATED : July 10, 2007
INVENTOR(S) : Kishi et al.

It is certified that error appears in the above-identified patent and that said Letters Patent is hereby corrected as shown below:

At column 2, line 5, after the word "and", insert --an--.

At column 3, line 17, after the word "apparent", delete "form" and insert therefor --from--.

At column 3, line 23, before the words "a first", insert --to--.

At column 5, line 8, before the words "a first", insert --to--.

At column 14, line 36, after the word "placed", delete "to on" and insert therefor --on--.

At column 17, line 25, before the words "by an", delete "pressurize" and insert therfor --pressurized--.

At column 17, line 39, after the word "incorporated", delete "to" and insert therefor --into--.

Signed and Sealed this

Tenth Day of February, 2009

JOHN DOLL
*Acting Director of the United States Patent and Trademark Office*